(12) United States Patent
Sarrus et al.

(10) Patent No.: US 9,030,796 B2
(45) Date of Patent: May 12, 2015

(54) SYSTEM FOR SUPPLYING DIRECT CURRENT AND DC VOLTAGE PROTECTED BY A CURRENT LIMITER, AND METHOD FOR PROTECTING SAME

(75) Inventors: Franck Sarrus, Saint Laurent de Mure (FR); Thierry Rambaud, Genas (FR); Dominique Tournier, Lyons (FR); Philippe Godignon, Valldoreix (ES); Jean-François De Palma, Arlington, MA (US)

(73) Assignee: MERSEN France SB SAS, Saint-Bonnet-de-Mure (FR)

( * ) Notice: Subject to any disclaimer, the term of this patent is extended or adjusted under 35 U.S.C. 154(b) by 166 days.

(21) Appl. No.: 13/824,898

(22) PCT Filed: Dec. 1, 2011

(86) PCT No.: PCT/EP2011/071548
§ 371 (c)(1),
(2), (4) Date: Apr. 23, 2013

(87) PCT Pub. No.: WO2012/072759
PCT Pub. Date: Jun. 7, 2012

(65) Prior Publication Data
US 2014/0063672 A1    Mar. 6, 2014

Related U.S. Application Data

(60) Provisional application No. 61/419,012, filed on Dec. 2, 2010.

(30) Foreign Application Priority Data

May 20, 2011   (FR) .................................... 11 54442

(51) Int. Cl.
*H02H 3/08*  (2006.01)
*H02H 9/02*  (2006.01)
*H01L 31/02*  (2006.01)
*H02H 7/20*  (2006.01)

(52) U.S. Cl.
CPC .......... *H02H 9/025* (2013.01); *H01L 31/02021* (2013.01); *H02H 7/20* (2013.01); *Y02E 10/50* (2013.01)

(58) Field of Classification Search
USPC ................................................ 361/93.7–93.9
See application file for complete search history.

(56) References Cited

U.S. PATENT DOCUMENTS

| 4,454,523 | A | 6/1984 | Hill | |
|---|---|---|---|---|
| 8,198,835 | B2 * | 6/2012 | Yokoyama et al. | 318/139 |
| 8,410,756 | B2 * | 4/2013 | Sakakibara et al. | 320/118 |

FOREIGN PATENT DOCUMENTS

| FR | 2 894 401 A1 | 6/2007 |
|---|---|---|
| WO | 2011032693 A2 | 3/2011 |

OTHER PUBLICATIONS

International Search Report dated Feb. 28, 2012 for International Application No. PCT/EP2011/071548.

*Primary Examiner* — Danny Nguyen
(74) *Attorney, Agent, or Firm* — Knobbe Martens Olson & Bear LLP

(57) ABSTRACT

A system for supplying direct current and DC voltage is provided. The system comprise a first supply branch having a first DC voltage source and a power field-effect transistor of a current limiter which are connected in series, and a second supply branch having a second DC voltage source. The power transistor has a current/voltage characteristic with a first inverse polarization area without current limitation, and a second conduction area with current limitation based on a current threshold. The power field-effect transistor is connected to the first voltage source with an inverse polarization when the voltage source of the first branch is operating normally.

13 Claims, 10 Drawing Sheets

SYSTEM FOR SUPPLYING DIRECT CURRENT AND DC VOLTAGE PROTECTED BY A CURRENT LIMITER, AND METHOD FOR PROTECTING SAME

CROSS REFERENCE TO RELATED APPLICATIONS

This application is the U.S. National Phase of International Application No. PCT/EP2011/071548, filed Dec. 1, 2011, designating the U.S. and published as WO 2012/072759 on Jun. 7, 2012 which claims the benefit of U.S. Provisional Application No. 61/419,012, filed Dec. 2, 2010 and French Patent Application No. 11 54442, filed May 20, 2011.

FIELD OF THE INVENTION

The present invention relates to a system for supplying direct-current and DC voltage with a current limiter to protect against internal short-circuit defects of its components, and a method for protecting the power supply system in the event such a defect occurs.

BACKGROUND OF THE INVENTION

Direct-current and DC voltage power supply systems including at least two electrical supply branches connected in parallel are known, in which, during normal operation, each electrical supply branch is a DC voltage generator having an electromotive force of the same amplitude and oriented in the same direction.

A photovoltaic electrical power supply system is one example of such a system. It includes at least two photovoltaic strings that are connected in parallel. The photovoltaic strings are configured each to provide, on the one hand an electromotive force of the same voltage amplitude and polarized in the same direction, and on the other hand a same load current.

The photovoltaic strings are each made up of a series of a same number of photovoltaic modules, which in turn are identical arrangements of photovoltaic cells. The photovoltaic strings are connected in parallel and thereby, when they operate normally, produce a voltage generator whereof the output voltage is equal to the electromotive force of any one of the photovoltaic strings and whereof the load current is equal to the sum of the load currents withdrawn by the photovoltaic strings.

To protect the electrical power supply against an internal short-circuit of one or more modules of one of the power supply strings, or against an event equivalent to a short-circuit of that type, it is known to place in series, on a power supply string capable of having such a defect, a fuse calibrated suitably to cause it to melt in case of defect.

It is also known to place, in series on a power supply string that may become defective, a circuit breaker adjusted suitably to react in case of the occurrence of an internal short-circuit on the power supply string, the short-circuit potentially being able to be accompanied by grounding of one or more modules of the power supply string.

One drawback of the solution using the fuse is the need for manual operation to replace the fuse. Furthermore, in the event the defect is temporary, the return to operation of the temporarily defective string takes time due to the need for human intervention.

One drawback of the solution using the circuit breaker is the need for an automatic rearming mechanism that is bulky and requires an external energy source. Furthermore, in the event of a short-term temporary defect, the rearming time may be lengthy, and efforts are being made to decrease the time to again connect the power supply string on the power supply system when the string is once again in a normal operating state, i.e., in a state with no short-circuit defect internal to one or more of its modules.

SUMMARY OF INVENTION

The invention aims to resolve the aforementioned drawbacks.

To that end, the invention relates to an electrical power supply system, capable of supplying an electrical charge with a predetermined power supply current, comprising a first supply branch and a second supply branch connected in parallel, the first supply branch including, connected in series, a first voltage source and a current limiter, and the second supply branch including the second voltage source, the first voltage source and the second voltage source each having, when they operate normally, a same electromotive force whereof the polarization direction and the amplitude are identical to the polarization direction and the amplitude of the supply voltage, the current limiter including a field effect power transistor with a first electrical connection terminal and a second electrical connection terminal and whereof a power channel defined between the first terminal and the second terminal forms an electric dipole connected in series to the first voltage source at the second connection terminal, the power transistor having an evolution characteristic of an electrical current passing through the power channel as a function of a differential electrical voltage between the first and second connection terminals, the differential electrical voltage being equal to an electrical voltage of the first terminal minus the electrical voltage of the second terminal and the electrical current passing through the power channel having a positive direction when it goes from the first connection terminal toward the second connection terminal, the evolution characteristic of the power transistor comprising a first inverse polarization area, wherein the electrical voltage and the current have the same negative direction and the current passing through the channel is not limited, and a second single-direction current limiting area, in direct conduction, in which the differential electrical voltage and the electrical current have the same direction and are positive and the electrical current passing through the power channel is current-limited from a current threshold, characterized in that the field effect power transistor is connected to the first voltage source with an inverse polarization, in a configuration where the voltage differential of the power transistor and the electromotive force of the first voltage source, when the first supply branch operates normally, are opposite, and the first supply branch is configured so that, when a defect occurs on the first voltage source, the electromotive force of the first voltage source is lower than the electromotive force of the second voltage source and the first supply branch operates as a receiver with respect to the second supply branch.

According to specific embodiments, the power supply system includes one or more of the following features, considered alone or in combination:

the voltage difference between the electromotive force of
the second voltage source and the electromotive force of
the defective first voltage source is greater than or equal
to 20 V.

the ratio of the electromotive force of the defective first voltage source to the electromotive force of the second voltage source is less than or equal to 90%.

the field effect power transistor is a field effect transistor comprised in the family of JFET and MOS transistors, and whereof the semiconducting substrate is made from a material with a wide band gap comprising silicon, silicon carbide, gallium nitride GaN and diamond, preferably silicon or silicon carbide.

the power transistor is a transistor of the VJFET type whereof the substrate is made from silicon carbide.

the current limiter comprises:

the field effect power transistor having a drain electrode, a source electrode, and a gate electrode for controlling a saturation current, an image current sensor capable of providing an image current that is representative of the power current passing through the power channel of the power transistor, a sensor for a temperature that is representative of a temperature prevailing within the power transistor, a control unit of the current limiter capable of commanding the power transistor as a function of measurement parameters comprised in the set made up of the temperature measured by the temperature sensor and the image current measured by the current sensor.

The power transistor comprises one or more basic power transistors, each basic power transistor comprising:

a substrate of a first conductivity type having a first lower face and a second upper face, a drain electrode in contact with the first lower face of the substrate, a first semiconducting region of the first conductivity type having a second lower face arranged on the first upper face of the substrate, and a second upper face, second and third semiconducting regions of a second conductivity type, partially buried, arranged inside the first semiconducting region under the second upper face and defining a vertical channel inside the first region, a fourth semiconducting region of the first conductivity type, with a surface gate, centrally, partially and respectively covering a third and fourth upper face of the second and third regions, the fourth region forming a side channel, a fifth semiconducting region of the second conductivity type centrally and partially covering a fifth face of the fourth semiconducting region, a first control gate electrode positioned on the surface of the fifth region, at least one contact area positioned under the fifth face in an area not covered by the fifth region, and at least one source electrode positioned on the at least one contact area, and a second gate electrode positioned either on a sixth upper face, or on a seventh upper face in an area not covered by the fourth semiconducting region.

The power transistor comprises a second gate electrode and a third gate electrode respectively positioned on the fifth upper face and the sixth upper face in areas not covered by the fourth semiconducting region, the two contact areas, positioned on either side of the vertical channel, under the fourth upper face in areas not covered by the fifth region, two source electrodes each positioned on a different contact area.

the second gate electrode is positioned on the second semiconducting region, the power transistor comprises a single source electrode and a single contact area of the source electrode, and the source electrode, in a single piece, covers both the contact area and an area of the third semiconducting region not covered by the fourth semiconducting region.

The invention also relates to a method for protecting a power supply system using a current limiter, the power supply system being able to supply an electrical charge of a predetermined supply current with a predetermined supply voltage, and comprising a first supply branch and a second supply branch connected in parallel, the first supply branch including, connected in series, a first voltage source and a current limiter, and the second supply branch including a second voltage source, the first voltage source and the second voltage source each having, when they operate normally, a same electromotive force whereof the polarization direction and the amplitude are identical to the polarization direction and the amplitude of the supply voltage, the current limiter including a field effect power transistor with a first electrical connection terminal and a second electrical connection terminal, and whereof a power channel defined between the first terminal and the second terminal forms an electric dipole connected in series to the first voltage source at the second connection terminal, the power transistor having an evolution characteristic of an electrical current passing through the power channel as a function of a differential electrical voltage between the first and second connection terminals, the differential electrical voltage being equal to an electrical voltage of the first terminal minus an electrical voltage of the second terminal and the electrical current passing through the power channel having a positive direction when it goes from the first connection terminal toward the second connection terminal, the evolution characteristic of the power transistor comprising a first inverse polarization area, in which the electrical voltage and current have a same negative direction and the current passing through the channel is not limited, and a second single-direction current limiting area, in direct conduction, in which the differential electrical voltage and the electrical current have the same direction and are positive and the electrical current passing through the power channel is current-limited from a current threshold, the field effect power transistor being connected to the voltage source with an inverse polarization such that the differential voltage of the power transistor and the electromotive force of the first voltage source, when the first supply branch operates normally, are opposite, and the first supply branch being configured such that, when a defect occurs on the first voltage source, the electromotive force of the first voltage source is lower than the electromotive force of the second voltage source and the first supply branch operates as a receiver with respect to the second supply branch, characterized in that the protection method comprises:

a first step in which, when the first supply branch operates normally, the power transistor operates in the first area, in inverse polarization without current limitation, a second step in which, when a defect occurs on the first voltage source of the first supply branch, the power transistor operates in the second area, in direct conduction with current limitation from a current threshold value.

According to specific embodiments, the protection method for the supply system includes one or more of the following features, considered alone or in combination.

the field effect power transistor having a drain electrode, a source electrode, and a gate electrode for controlling the saturation current, an image current sensor capable of providing an image current that is representative of the power current passing through the power channel of the power transistor, a control unit of the current limiter capable of commanding the power transistor as a function of the image current measured by the current sensor, and wherein in the first step, the gate of the power transistor is set to a first reference control voltage value, and wherein the method comprises a step, before the second step and after the first step, wherein the image current sensor measures the current representative of the power current passing through the power transistor, when a defect occurs on the first supply branch, the power current and the image current invert their directions and when the image current exceeds a first activation threshold value, the control unit sends a command to set the voltage of the gate of the power transistor to a second gate voltage value so as to adjust a second saturation value of the power current, when the first supply branch operates normally, the control voltage of the gate remains at the first control value and the power transistor operates in a first area.

the current limiter also comprises a sensor for a temperature that is representative of a temperature prevailing within the power transistor, and the control unit of the current limiter is capable of commanding the power transistor as a function of measurement parameters comprised in the set consisting of the temperature measured by the temperature sensor and the image current measured by the current sensor, and in this step, the temperature sensor measures the temperature and the current sensor measures the image current, when a defect occurs on the first voltage source of the first supply branch, the power current and the image current invert their directions and when the temperature exceeds a first temperature activation threshold value while increasing and/or when the image current exceeds a first image current activation threshold value while increasing, the control unit sends a command to set the voltage of the gate of the power transistor to a conservative control voltage value relative to the state exceeding the pair formed by the first image current activation threshold and the first temperature activation threshold, the conservative control voltage value being the voltage value from among the second and third control voltage values that corresponds to the smallest saturation current value when the first image current activation threshold and the first temperature activation threshold are exceeded, the value of the conservative control voltage being equal to the second control voltage value when only the first image current activation threshold is exceeded, the value of the conservative control voltage being equal to the third control voltage value when only the first temperature activation threshold is exceeded.

When no current circulates in the power transistor and the current sensor provides an image value thereof corresponding to a bias, the temperature sensor continues to monitor the image current, and when an inversion of the current is detected by the current sensor that is representative of the switch of an operation of the limiter from the first area into the second area, the control voltage completely inhibiting circulation of the power current in the power transistor is eliminated.

BRIEF DESCRIPTIONS OF THE DRAWINGS

The invention will be better understood upon reading the description of several embodiments that follows, provided as examples and done in reference to the appended drawings, in which.

Figure 1:
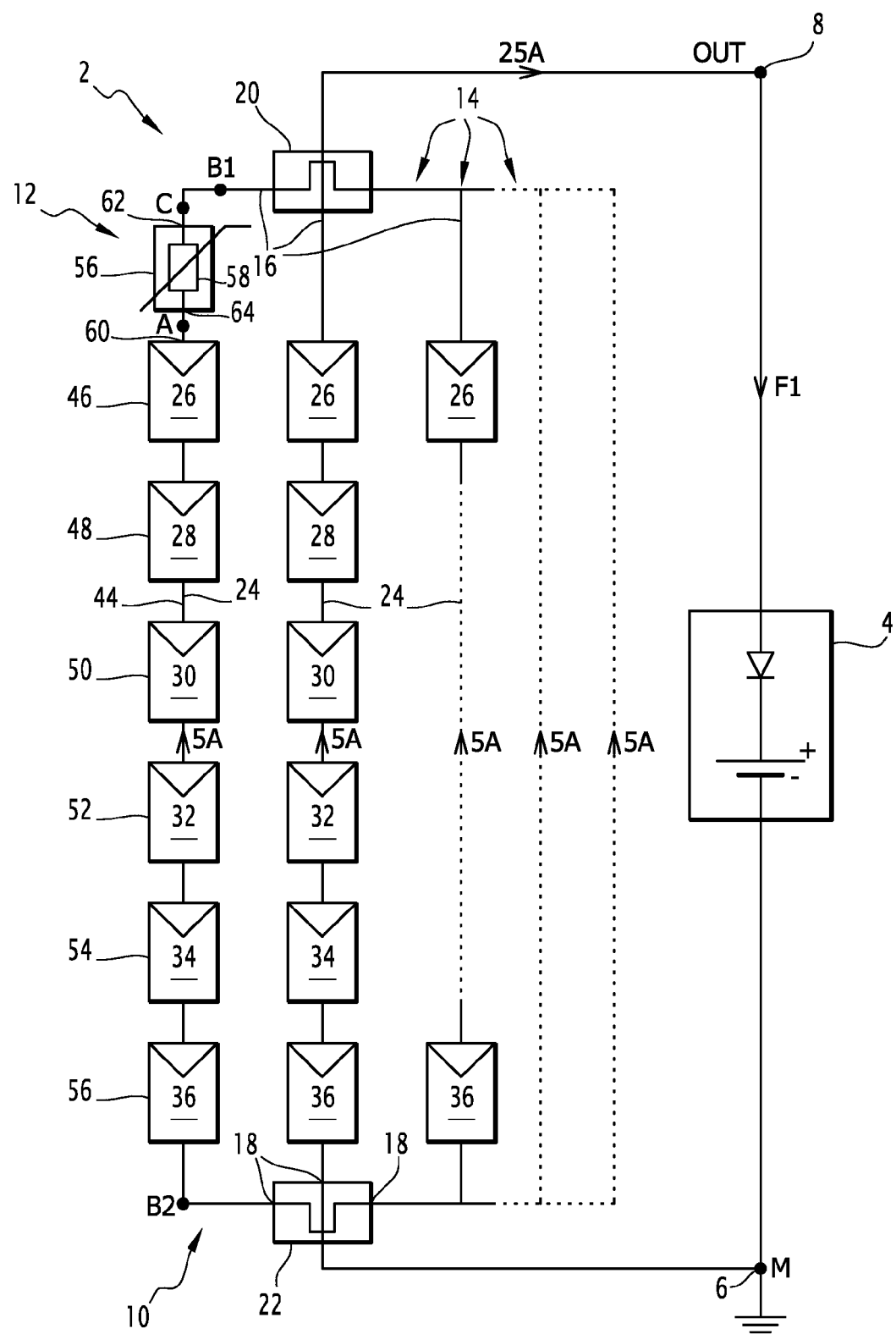
FIG. 1 is a view of a photovoltaic power supply system according to the invention that supplies an electrical charge under normal operation.
Figure 5:
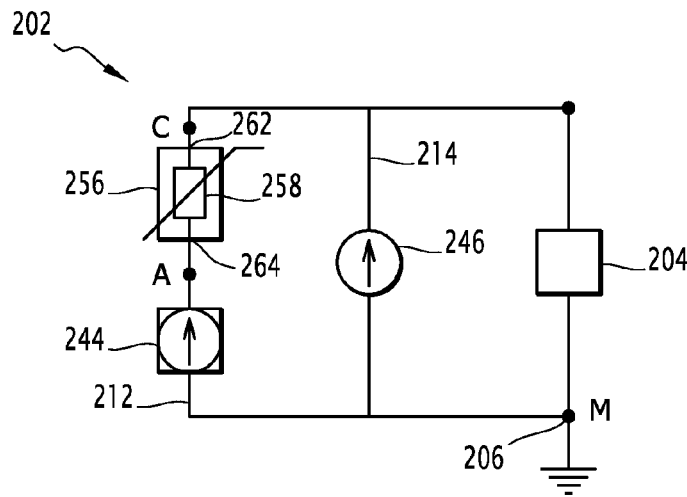
FIG. 5 is a view of an electrical power supply system according to the invention generalizing the photovoltaic system shown in FIG. 1.
Figure 14:
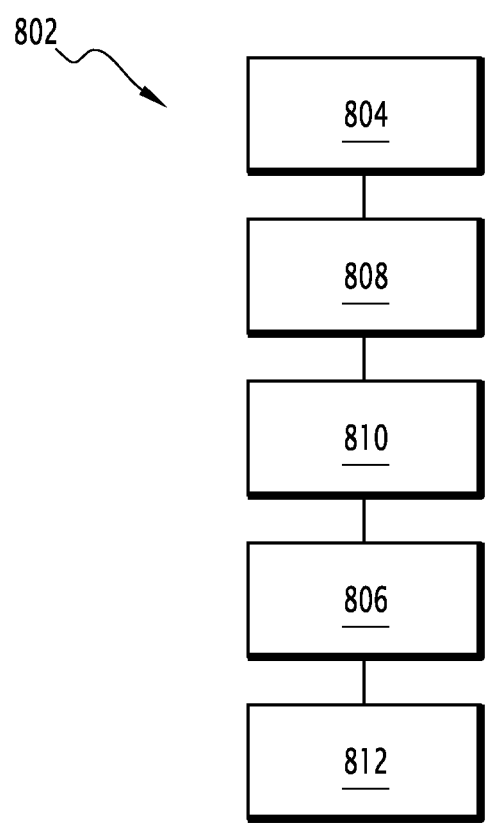
Figure 15:
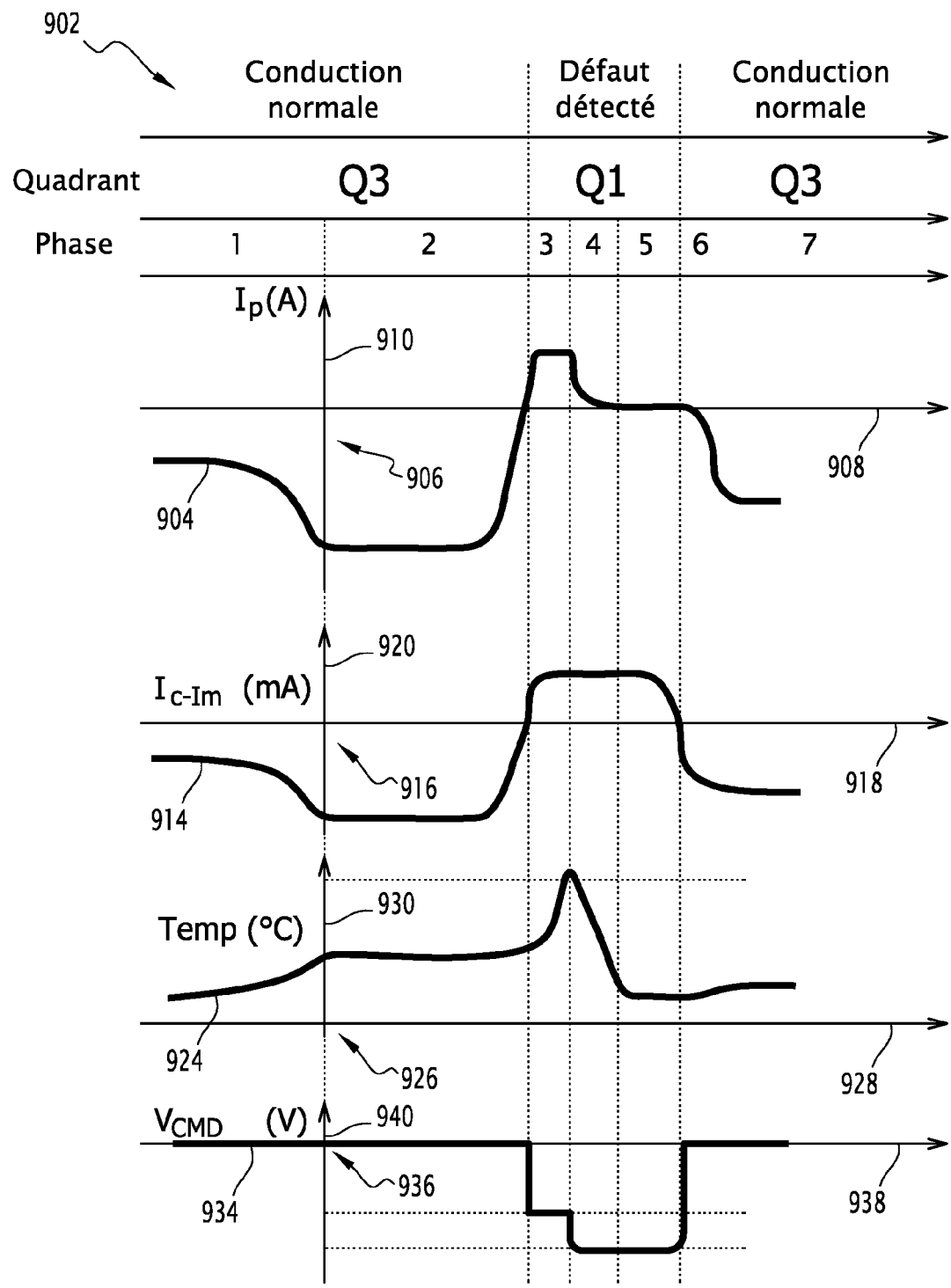

FIG. 14 is a flowchart of a method for protecting the power supply system of FIGS. 1 and 5; and FIG. 15 shows the temporal evolution of characteristic parameters comprised in the assembly formed by the power current of the power transistor, the sensed image current, the temperature, the control voltage of the gate of the power transistor in the case of a particular operating sequence of the power supply system of FIG. 1.

DETAILED DESCRIPTION OF THE EMBODIMENTS

According to FIG. 1, a DC voltage and direct current photovoltaic electrical power supply system 2 is connected to an electrical charge 4, for example an electrical inverter followed downstream by an array of charges, through a first ground terminal 6 under a reference voltage, here equal to 0 V, and a second output terminal 8 under a positive voltage designated Vs, here equal to 600 V.

The photovoltaic power supply system 2 is configured to provide, as output to the charge 4, a stable electrical voltage, independent of any charge variation of the electrical charge 4.

When it operates normally, the photovoltaic power supply system 2 is configured to provide, as output, a voltage with an amplitude equal to 600 V and a DC current with an ampere rating equal to 25 A.

The electrical power supply system 2 comprises a set 10 of supply branches 12, 14 connected in parallel, here five branches, only two of which 12, 14 are completely shown in FIG. 1, each branch 12, 14 having a first end 16 and a second end 18.

The electrical power supply system 2 comprises a first junction box 20, a second junction box 22, respectively, configured to connect the first ends 16 of the branches 12, 14, the second ends 18 of the branches 12, 14, respectively, to each other and to the terminals 6 and 8.

Each supply branch 12, 14 comprises an assembly having a same structure 24 of six power supply modules 26, 28, 30, 32, 34, 36 connected serially. Any assembly 24 of power supply modules is called a string of modules.

At least one of the branches, here the branch designated by reference 12 in FIG. 1, and in the rest of the description called the first branch 12, may encounter an operating defect over the course of its life.

The operating defect of a supply branch is typically the internal short-circuiting of one or more of the modules of its string.

The defect may also be the equivalent of an internal short circuit of one or more modules, for example such as shade from a cloud depriving one or more modules of sunlight. The string containing those shaded modules then has a lower electromotive force than the other power supply strings. It then behaves like a receiver, whereof the voltage and current are inverted at the same time.

In the rest of the description, to distinguish between the elements making up the first supply branch 12 and the other supply branches 14, the string 24 modules, the modules 26, 28, 30, 32, 34, 36 of the first branch 12 are respectively designated using references 44, 46, 48, 50, 52, 54, 56.

The first string 12 comprises a current limiter 56 having a field effect power transistor 58 (FET), serially connected between the first end 16 of the first branch 12 and one end 60 of the string 44, forming a first input terminal of the module 46.

The current limiter 56 comprises a first power terminal 62 and a second power terminal 64, the first power terminal 62 being connected to the first junction box 20 through the first end 16 of the first branch 12, the second terminal 64 being connected to the first terminal 60 of the module 46 making up the first end module of the first string 44.

In normal operation, each power supply module 26, 28, 30, 32, 34, 36, 46, 48, 50, 52, 54, 56 is a basic voltage source and comprises an arrangement of photovoltaic cells not described in detail here.

For example, the basic voltage source of a power supply module is a voltage source having an electromotive force equal to +100 V, and capable of withdrawing an ampere rating of 5 amperes during normal operation.

Each supply branch 12, 14, during normal operation, is a voltage source with an electromotive force equal to +600 V and configured to provide an ampere rating of 5 A.

The supply branches 12, 14 are connected in parallel and their electromotive forces are oriented in the same direction, such that the power supply system 2 is configured to provide, during normal operation, a rated DC current of 25 A with a DC voltage of 600 V.

Current directions are shown in FIG. 1 accompanying ampere rating values 5 A and 25 A. Out of convention, the directions of the ampere ratings 5 A are negative when those ratings are entering the junction box 20.

If M designates a reference point of the first grounding terminal 6 of the power supply system 2 and OUT designates a point of the second power supply output terminal 8 for applying the positive output voltage Vs, the current that passes through the charge 4 is oriented from the point OUT toward the point M in the direction of an arrow F1.

If B1 designates a point of the first end 16 of the first branch 12, and B2 designates a point of the second end 18 of the first branch 12, during normal operation, the voltages applied and observed at those two points are respectively equal to +600 V and 0 V.

Likewise, the voltages applied and observed at the first ends 16 and second ends 18 of the other supply branches 14 are respectively equal to +600 V and 0 V.

During normal operation, the voltage applied at the point A to the second terminal 64 of the limiter 56 is slightly above 600 V, here equal to 601 V, so as to compensate for the voltage drop of the first branch 12 caused by the current limiter 56, the voltage drop here being equal to 1 V for an ampere rating of 5 A.

The current limiter 56 is connected as an electric dipole, serially through its first terminal 62 and its second terminal 64, relative to the voltage source formed by the first string 44 of the modules 46, 48, 50, 52, 54, 56.

To simplify the notations, a point A designates a point of the second terminal 64 with a voltage $V_A$ and a point C designates a point of the first terminal 62 with a voltage $V_C$. The differential electrical voltage of the current limiter 56 is the difference between the voltage observed at the first terminal 62 and the voltage observed at the second terminal 64, and is denoted $V_{AC}$, with $V_{AC}$ equal to $V_C$ minus $V_A$.

The current limiter 56 has an evolution characteristic of the electrical current, designated by I, passing through the current limiting device as a function of the electrical voltage between the two connection terminals $V_{AC}$.

In the definition of this characteristic, out of convention, the direction of the current is positive when the current passes through the limiter from C toward A.

The current(I)/voltage($V_{AC}$) evolution characteristic curve comprises a first inverse conduction area, in which the electrical voltage and the current are in the same direction and negative, and the current is not limited when the voltage $V_{AC}$ decreases, i.e., increases in the direction of the negative values, and a second direct conduction area, in which the electrical voltage $V_{AC}$ and the electrical current I passing through the current limiter are in the same direction and are positive, and in which the electrical current is limited from a current threshold.

Alternatively, the first area comprises a sub-area in which the slope of the current/voltage characteristic, i.e., the conductance, has the same sign and the same amplitude as a mean slope of the second area of the characteristic curve before the limitation of the current.

The first area is placed in a third quadrant, denoted quadrant Q3, defined by the negative current half-axis and the negative voltage half-axis.

The second area is placed in a quadrant called the first quadrant, denoted quadrant Q1, defined by the positive current half-axis and the positive voltage half-axis $V_{AC}$.

The current limiter 56 is connected to the voltage source of the first branch 12 inversely from the electromotive force of the first supply branch 12, such that, when the first branch 12 operates normally, i.e., as a generator, the current I passes through the limiter from A toward C while having a negative direction and the differential voltage $V_{AC}$ at the terminals of the limiter, $V_C$ minus $V_A$, is negative.

Thus, the current limiter operates in the first area when the first branch 12 operates normally and in the second area when an internal short-circuit defect occurs on the first branch 12.

When the first branch operates normally, the voltage $V_A$ is equal to +601 volts, and an ampere rating of 5 A passes, from A to C, through the current limiter 56, which operates in the first area placed in the third quadrant.

This negative current with the sign conventions of the current/voltage characteristic causes a voltage drop at the terminals of the limiter 56, $V_{AC}$ equal to +1 volts, which means that the voltage $V_C$ is equal to 600 V.

The field effect power transistor 58 is unipolar, i.e. unidirectional in current limitation. Here, the power transistor 58 is of the N channel type, i.e., has a semiconducting junction doped by negative electrical charges.

The field effect power transistor 58 is a field effect power transistor comprised in the group consisting of junction field effect transistors (JFET) and metal oxide silicon field effect transistors (MOSFET).

Preferably, the field effect power transistor is a junction field effect transistor (JFET), also called a junction gate field effect transistor (JUGFET).

Also preferably, the field effect power transistor is a vertical junction field effect transistor (VJFET).

Alternatively, the current limiter 56 includes a field effect power transistor of the P channel type, i.e., having a semiconducting junction doped by positive electrical charges or holes. In that case, the transistor is integrated suitably into the power supply system.

The semiconducting substrate base of the power transistor 58 is made from a material comprised among silicon and silicon carbide.

Preferably, the material of the semiconducting substrate is silicon carbide.

Generally, the material of the semiconducting substrate is a wideband material, for example such as silicon, silicon carbide, gallium nitride GaN, and diamond.

Preferably, the current limiter 56 includes a vertical junction field effect power transistor 58 (VJFET) with an N type channel and a P type gate junction.

Figure 2:
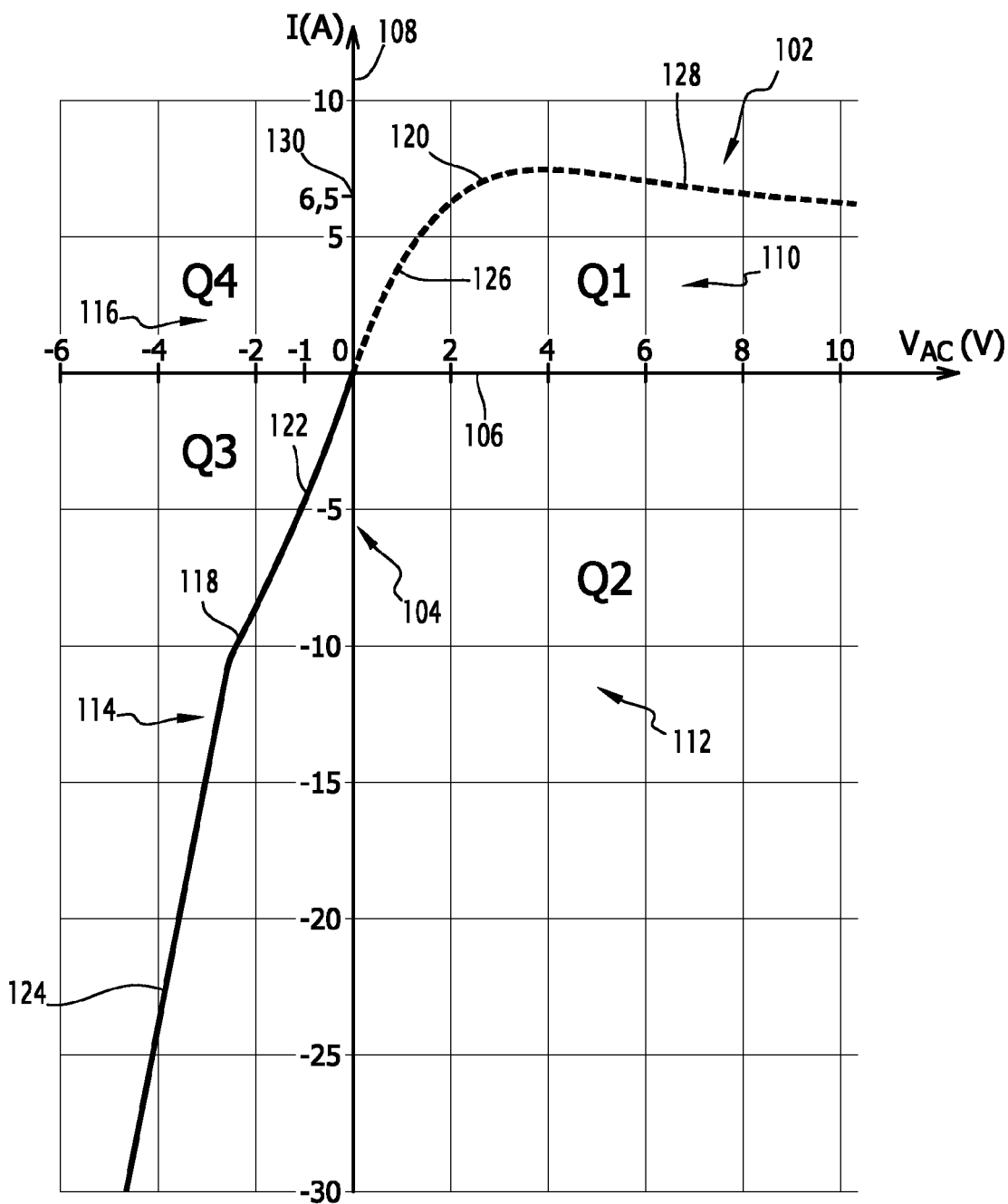
FIG. 2 is a view of the evolution curve of the current as a function of the voltage of the terminals of a power transistor of a current limiter integrated into one of the branches of the power supply system of FIG. 1.

According to FIG. 2, a current/voltage $V_{AC}$ evolution characteristic 102 of a VJFET is shown, the VJFET transistor being configured to operate integrated in the power supply system 2 of FIG. 1.

The evolution characteristic 102 of the current I as a function of the voltage difference $V_{AC}$ at the terminals of the limiter is shown in a reference 104 having, on the X axis, a first axis 106 of the voltages $V_{AC}$ whereof the unit is expressed in volts, and on the Y axis, a second current I axis 108 whereof the unit is expressed in amperes.

The reference comprises four quadrants, a first 110, second 112, third 114, and fourth 116 quadrant, respectively designated in FIG. 2 by references Q1, Q2, Q3 and Q4.

The first quadrant Q1 is delimited by the positive current half-axis and the positive voltage half-axis.

The second quadrant Q2 is delimited by the negative current half-axis and the positive voltage half-axis.

The third quadrant Q3 is delimited by the negative current half-axis and the negative voltage half-axis.

The fourth quadrant Q4 is delimited by the positive current half-axis and the negative voltage half-axis.

The current/voltage evolution characteristic 102 here is a curve comprising a first curve area 118, placed in the third quadrant Q3 and representative of the inverse polarization regime of an N-type channel VJFET, and a second curve area 120, continuously connected to the first curve area 118 at the origin of the reference 104, placed in the first quadrant Q1 and representative of the direct polarization regime of the N-type channel VJFET.

Here, the evolution characteristic 102 is shown for a gate voltage set at a predetermined value, the appearance or shape of the variations being independent of the value of the gate voltage of the VJFET transistor.

The first area 118 of the evolution curve is not current-limited in inverse polarization regime.

In inverse polarization, the JFET is approximately comparable to a first resistance R1 when the inverse polarization is low, here greater than −3 volts, and the first resistance placed in parallel with the diode D1 with a high injection regime when the inverse polarization is strong, here $V_{AC}$ less than −3 volts.

Here, the value of −3 volts corresponds to a JFET whereof the semiconducting substrate is made from silicon carbide. When the semiconducting substrate of the JFET is made from silicon, that value is equal to −0.7 volts.

The diode D1 is the diode formed by the source junction of the N doped P-channel type of the VJFET power transistor 58 and its resistance, designated by a second resistance R2, has a much lower value than that of the first resistance R1, by at least 10 in order of magnitude.

Thus, the first area 118 comprises a first sub-area 122 with a linear profile for $V_{AC}$ here comprised between −3 volts and 0 with a first conductance slope, and a second sub-area 124 for $V_{AC}$ less than −3 Volts with a second conductance slope, the second slope being at least 10 times larger than the first slope.

The VJFET power transistor 58 is configured and dimensioned such that the ratio of the power dissipated by the limiter 56 placed in its operating point, here −1 volts and −5 A, to the power delivered by the supply branch 12 in which the limiter is serially mounted, is below a predetermined value. Here as an example, this ratio of the powers is equal to 5/3000.

In direct polarization, the VJFET transistor 58 is comparable to a traditional limiter and the second area 120 successively comprises a first sub-area 126 and a second sub-area 128 each respectively having a first slope and a second slope.

The first sub-area 126 is a direct polarization conduction area for which the first conductance slope is substantially equal to the first conductance slope of the first sub-area 122 of the first area 118 corresponding to the inverse polarization regime.

The second sub-area 128 is a current-limiting area that is effective from a limiting current threshold 130, the value of which here is equal to 1.3 times the value of the ampere rating of the first supply branch when the latter operates normally, i.e., equal to 6.5 A.

Thus, the first sub-area 126 and the second sub-area 128 are respectively defined for current values comprised between 0 and 6.5 A and for values above 6.5 A and below a peak current.

Figure 3:
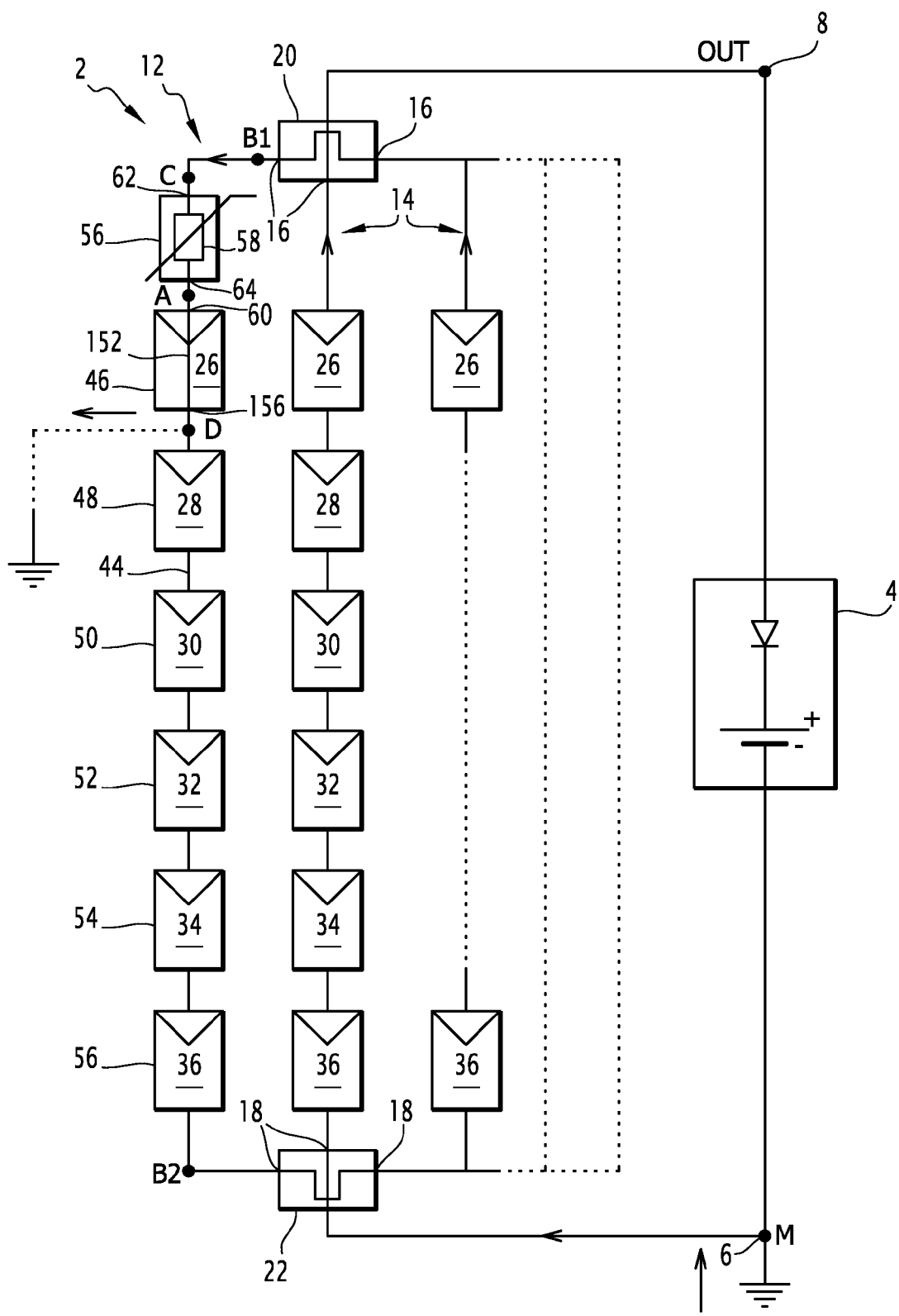
FIG. 3 is a view of the photovoltaic power supply system of FIG. 1 in the case of a first defect configuration of a power supply string.

According to FIG. 3, a first defect configuration of the first branch 12 is shown, in which a short-circuit internal to the module 46 occurs with grounding of that module.

The first supply branch 12 then operates as a receiver subject to the voltage Vs of the other supply branches 14, here 600 V, in its first end 16, i.e., at the point B1. The other supply branches 14 connected in parallel are together equivalent to a single voltage generator with respect to the first branch 12, the output impedance of that generator being equal to the output impedance of the first supply branch 12 operating as a receiver and being independent of the charge 4 of the network.

The short-circuit of the module 46 is shown in FIG. 3 by a fully conducting wired connection 152 connecting the two end connection terminals of the module 46.

The voltage $V_A$, observed at the first end terminal 60 of the module 46 connected to the second terminal 64 of the limiter 58, is then the same as the voltage $V_D$, applied at a point D to a second end terminal 156 of the module 46, connected serially to the string of non-defective modules 48, 50, 52, 54, 56, the voltage $V_D$ being equal to +500 volts.

The voltage $V_C$ observed at the first terminal 62 of the current limiter 58 is equal to the voltage Vs of the first end 16 of the other supply branch is 14, i.e., the voltage $V_B$, and it is equal to +600 volts.

The voltage difference $V_{AC}$ applied between the first terminal 62 and the second terminal 64 is then positive and equal to +100 volts and changes sign relative to the voltage observed at the terminals of the limiter 56 when the first branch operates normally.

The current limiter 56 then operates in the second area 120 of its characteristic in current limiting mode, i.e., in the first quadrant 110.

The current that passes through the limiter 56 increases until it reaches and exceeds the current limiting threshold value 130, here equal to 6.5 A, to then be attenuated in the second sub-area 128 of the second area 120.

Figure 4:
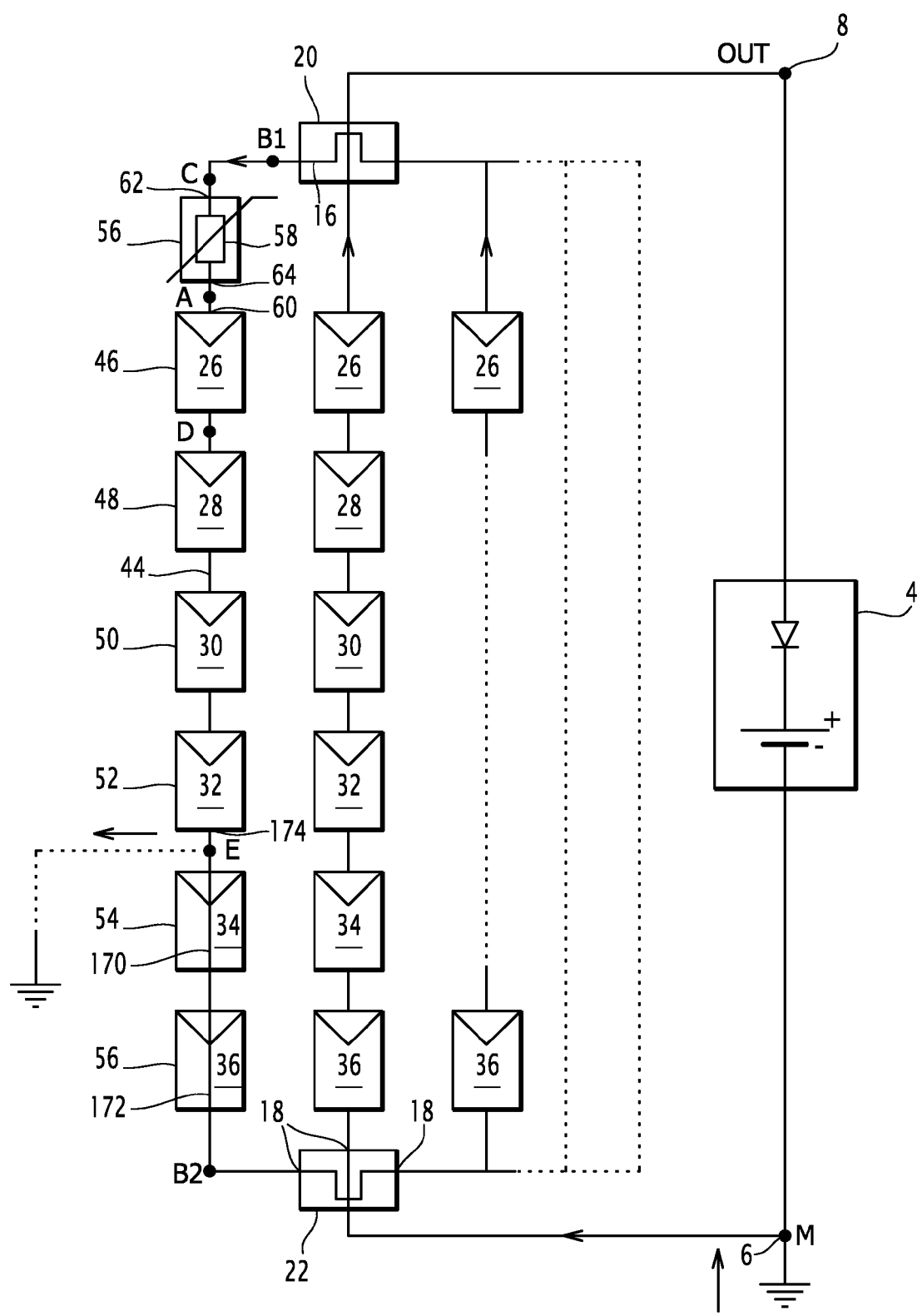
FIG. 4 is a view of the photovoltaic power supply system of FIG. 1 in the case of a second defect configuration of a power supply string.

According to FIG. 4, a second defect configuration of the first branch 12 is shown in which a short-circuit internal to the two modules 54 and 56 of the first supply branch 12 directly connected serially occurs with grounding of the two modules 54, 56.

The short-circuit of the two modules 54, 56 is shown in FIG. 4 by two fully conducting wired connections 170, 172 respectively passing all the way through the two modules 54, 58.

The first supply branch 12 then operates as a receiver subject to the voltage $V_S$ of the other supply branches 14, here +600 volts, at its first end 16, i.e., at the point B1. The other supply branches 14, connected in parallel, are together equivalent to a single voltage generator with respect to the first branch 12, the output impedance experienced by that generator being equal to the output impedance of the first supply branch 12 operating as a receiver and being independent of the charge 4 of the network.

The voltage $V_E$, observed at the point E at an end terminal 174 of the string of the four modules 46, 48, 50, 52 that are in a normal operating state, the terminal 174 being connected to the defective module 54, is equal to the voltage $V_M$ of the reference point M at the ground 6, i.e., 0 V, due to the short-circuits of the modules 54, 56 mounted serially.

The voltage $V_A$ applied and observed at the second terminal 64 of the current limiter 58 is then equal to +400 volts.

The voltage $V_C$ applied to the first terminal of the current limiter 58 is equal to the voltage Vs of the first end 16 of the other supply branches 14, i.e., equal to +600 volts.

The voltage difference $V_{AC}$ applied between the first terminal and the second terminal is then positive and equal to +200 volts and changes sign relative to the voltage observed at the terminals of the limiter 56 when the first branch 12 operates normally.

The current limiter 56 then operates in the second area 120 of its characteristic in the current limiting mode, i.e., in the first quadrant Q1.

The current that passes through the limiter 56 increases until it reaches and exceeds the current limiting threshold value 130, here equal to 6.5 A, to then be attenuated in the second sub-area 128 of the second area 120.

It should be noted that the analysis described for FIGS. 3 and 4 is applicable to any defect occurring on one or more modules of the first power supply string 12.

In all of these defect cases, the current limiter 56 is subject to both to an inversion of the voltage and the current at its terminals, causing it to go from an operating area with no current limitation contained in the third quadrant Q3 to an operating area with a current limitation contained in the first quadrant Q1.

In the case of a temporary or fleeting defect, when the defect has disappeared, i.e., when the first supply branch 12 regains its full capacity to operate as a voltage source, i.e., is capable of providing a voltage of 601 V, the current limiter 58 is subjected to an inversion in the other direction both of the voltage and the current at its terminals, causing it to go from an operating area with current limitation in the first quadrant Q1 to an operating area without limitation in a third quadrant Q3.

It is recalled that when the limiter is an N channel JFET transistor, the first quadrant Q1 corresponds to a direct polarization of the power transistor and the third quadrant III corresponds to an inverse polarization.

Thus, advantageously, without manual intervention, the current limiter 58 automatically switches from a normal inverse conduction operating mode to an operating mode protecting the first defective direct conduction power supply string, and vice versa if the defect is a temporary defect.

According to FIG. 5, a generalization of the photovoltaic power supply system is proposed in which an electrical power supply system 202 is configured to supply an electrical charge 204 equivalent to the assembly of a network to be supplied with DC current at a predetermined rated DC voltage.

The electrical array charge 204 has a predetermined impedance under the rated supply voltage when it receives a predetermined rated DC power supply charge current.

The electrical power supply system 202 comprises a first electrical supply branch 212 and a second electrical supply branch 214 connected in parallel on the electrical charge 204.

The first supply branch 212 includes, connected serially, a first voltage source 244 and a current limiter 256.

The current limiter 256 includes a field effect power transistor 258, configured to limit the current in one direction.

The second supply branch 214 includes a second voltage source 246.

The voltage sources 244, 246 of the two supply branches 212, 214 are polarized in a same direction and, when they both operate normally, each have an electromotive force substantially equal to the predetermined rated power supply voltage of the power supply source.

The field effect power supply transistor 258, connected serially to the first voltage source 244, forms an electric dipole.

The field effect power transistor 258 has a first connection terminal 262 connected to the charge 204 and a second connection terminal 264 connected to the first voltage source 244.

The field effect power transistor 258 is configured according to an evolution characteristic of the current passing through it as a function of the electrical differential voltage between its terminals 262, 264, the differential voltage being defined as the voltage applied to the first terminal 262 minus the voltage applied to the second terminal 264, and the direction of the current being positive when it circulates from the first terminal 262 toward the second terminal 264.

The evolution characteristic of the current as a function of the differential voltage of the field effect power transistor 258 comprises a first inverse polarization area, in which the differential electrical voltage and the electrical current have the same direction and are negative, and the current is not limited.

The characteristic of the field effect power transistor 258 comprises a second direct conduction area, in which the electrical differential voltage and current are in the same direction and positive, and the electrical current is limited from a current threshold value.

The field effect power transistor 258 is connected to the first voltage source 244 with an inverse polarization such that the differential voltage of the field effect transistor 258 and the electromotive force of the first voltage source 244 when the first supply branch 12 operates normally are opposite.

The first supply branch 212 is configured such that, when a defect occurs on the first voltage source 244, the electromotive force of the first voltage source 244 is lower than the electromotive force of the second voltage source 246, and the first supply branch 212 operates as a receiver with respect to the second supply branch.

When a defect occurs on the first voltage source 244, the field effect power transistor 258 operates in the second area and limits the current when the latter exceeds the threshold value. Thus, the field effect power transistor 258 protects the first supply branch 212 in the event of a defect on the first source. The transistor 258 also protects the power supply system 202 in its entirety, for example by avoiding a spreading thermal destruction effect.

Preferably, the voltage difference between the electromotive force of the second voltage source 246 and the electromotive force of the defective first voltage source 244 is at least greater than or equal to 20 V.

Preferably, the ratio of the voltage of the first defective voltage source 244 to the voltage of the second voltage source 246 is at least less than or equal to 90%.

Hereafter, the current limiters 56 and 256 are assumed to be identical.

Figure 6:
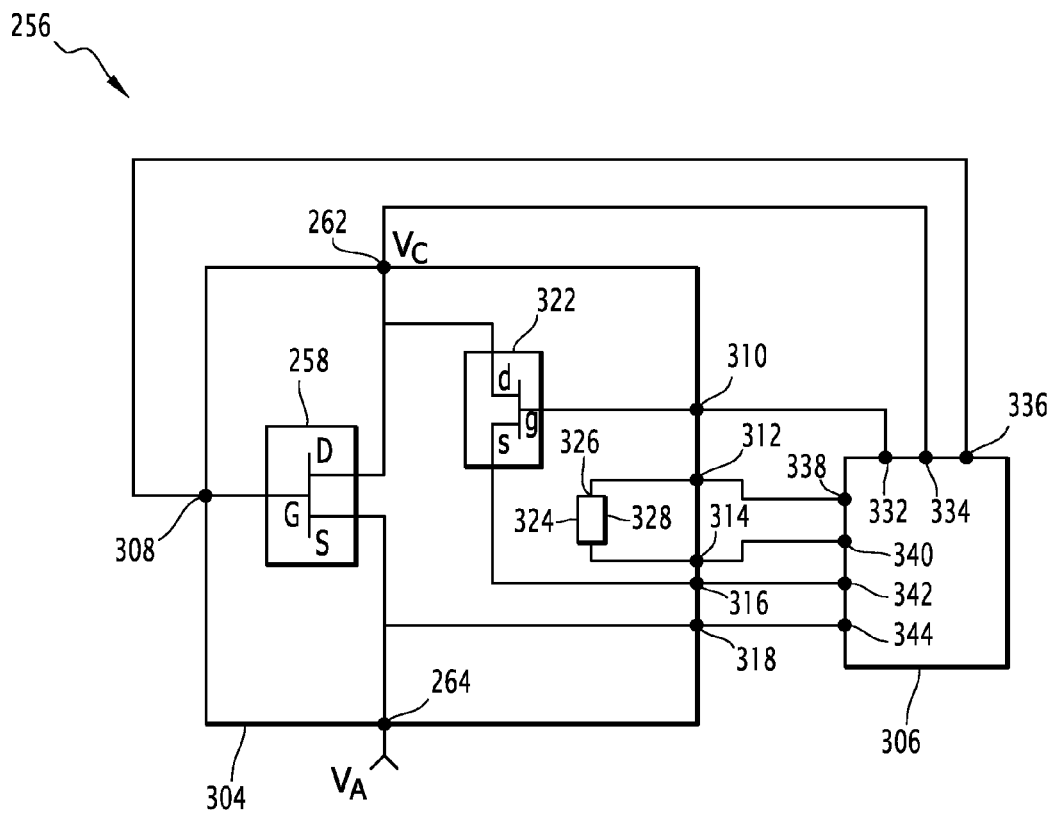
FIG. 6 is electrical diagram of a current limiter according to the invention, integrated into a supply branch of the power supply system of FIGS. 1 and 5.

According to FIG. 6, the current limiter 256 comprises an integrated electronic limiter component 304 and a control unit 306 of the limiter.

The integrated limiter component 304 comprises the first 262 and second 264 connection terminals of the limiter 256, which are the terminals through which the power supply current of the first supply branch 212 flows.

The integrated limiter component 304 comprises a third input terminal 308, capable of receiving a command for a limit threshold of the power current, and a fourth input terminal 310 for adjusting the capture gain of an image current.

The integrated limiter component 304 comprises a fifth input terminal 312 of the sixth output terminal 314 for a current representative of a temperature T prevailing within the integrated electronic component of the limiter 304.

The integrated limiter component 304 comprises a seventh input terminal 316 and an eighth output terminal 318 for an image current, representative of the power current passing through the connection terminals 262, 264 of the power transistor 258, the latter being connected in FIG. 5 to the first voltage source 244 of the first supply branch 212.

The integrated limiter component 304 comprises the field effect power transistor 258, an image current sensor 322, and a temperature sensor 324.

The field effect power transistor 258 includes a drain electrode D, a source electrode S, and a gate electrode G for controlling the saturation current of the transistor, i.e., the limiting current of the first defective branch 212. The gate electrode G, the drain electrode D, the source electrode S of the power transistor 258 are respectively connected to the third input terminal 308 for receiving the command for the current limit threshold, and the power connection terminals 262, 264.

The current sensor 322 is capable of providing an image current, representative of the current passing through the power transistor 258 between the source electrode S and the drain electrode D. The current sensor 322 is a transistor of the JFET type, electrically coupled to the power transistor 258, and has a gate g, a drain d, and a source s. The gate g, the drain d and the source s of the image current sensor 322 are respectively connected to the terminals 310, 262 and 316.

The temperature sensor 324 is configured to measure and provide a signal for a temperature T representative of the temperature prevailing within the power transistor 58. The temperature sensor 324 is a transistor configured to provide, through two access terminals 326, 328, respectively connected to the terminals 312, 314, a signal representative of the temperature T.

The control unit 306 of the limiter is configured to command the power transistor 258 as a function of measurement parameters comprised in the set made up of the temperature T, measured by the temperature sensor 324, and the image current, measured by the current sensor 322.

The control unit 306 comprises a first output terminal 332, a second input terminal 334, a third output terminal 336, a fourth input terminal 338, a fifth input terminal 340, a sixth input terminal 342 and a seventh input terminal 344, respectively connected to the terminals 310, 262, 308, 312, 314, 316 and 318 of the integrated component 304 of the limiter.

The first output terminal 332 is capable of providing a control signal to the gate g of the image current 322 and the second output terminal 334 is capable of receiving the voltage $V_C$ from the drain D of the power transistor 58 as the reference voltage of the transistor 58.

The third output terminal 336 is capable of providing the gate electrode G of the power transistor 58 with a voltage command $V_{CMD}$ to adjust the value of the saturation current as a function of measurement parameters provided by the integrated component of the limiter 304, i.e., the image current of the power transistor and/or the temperature T.

The fourth 338 and fifth 340 input terminals are capable of receiving the temperature signal T in the form of a differential voltage.

The sixth 342 and seventh 344 input terminals are capable of receiving the image current signal in the form of a current.

Figure 7:
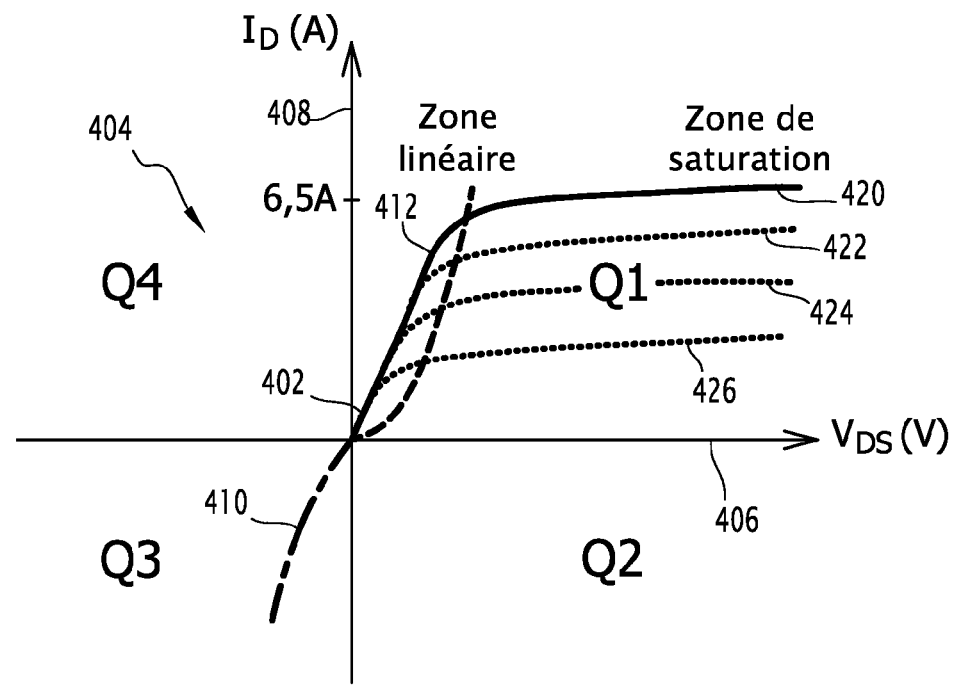
FIG. 7 shows characteristic evolution curves of the drain current of the power transistor partially forming the current limiter of FIG. 6, as a function of the drain-source differential voltage of the power transistor for various values of its gate voltage.

According to FIG. 7, a set of evolution characteristics 402 of the drain current $I_D$ as a function of the source(S)-drain(D) voltage $V_{DS}$ of the transistor 258, parameterized by the value of the gate G voltage $V_G$, is shown in a reference 404.

The reference 404 includes, on the X axis, a first voltage $V_{DS}$ axis 406, the voltage $V_{DS}$ being equal to the voltage $V_{AC}$, whereof the unit is expressed in volts, and on the Y axis, a second current $I_D$ axis 408, whereof the unit is expressed in amperes.

Like the reference 104 described FIG. 2, the reference 404 comprises four quadrants respectively designated by references Q1, Q2, Q3 and Q4.

The characteristics of the assembly 402 comprise a first shared inverse polarization area 410 that is independent of the value of the gate voltage $V_G$ and in which the power transistor 258 operates when the first supply branch 212 operates normally.

For each value of the gate voltage $V_G$, the characteristic comprises a second direct polarization area, formed by a first linear sub-area and a second linear sub-area connected to the first linear sub-area.

The slope of the first sub-area of the second area is substantially the same, independently of the value of the gate voltage $V_G$.

The slope of the second sub-area of the second area is substantially close to zero and is substantially the same, independently of the value of the gate voltage $V_G$.

The slope of the first sub-area is significantly larger than the slope of the second sub-area with a ratio greater than 10.

A second area in solid lines corresponds to a gate voltage value, here assumed to be equal to 0 V, for which the channel of the power transistor is slightly laterally pinched and the threshold value of the saturation current is greatest, here equal to 1.3 times the value of the power supply current of the first branch during normal operation, i.e., 6.5 A. The first sub-area and the second saturation sub-area corresponding to that gate voltage are respectively designated by numerical references 412 and 420.

Three other second areas are shown in dotted lines, each with their second sub-area, the sub-areas being designated by references 422, 424, 426. Each second sub-area 422, 424, 426 has a different associated gate voltage that decreases by increasing order of the reference numbers 422, 424, 426.

When the gate voltage $V_G$ decreases algebraically, i.e., when $V_G$ is negative and the amplitude of $V_G$ increases, the pinching of a channel of the field effect power transistor is higher, and the saturation limit value of the drain current decreases.

Figure 8:
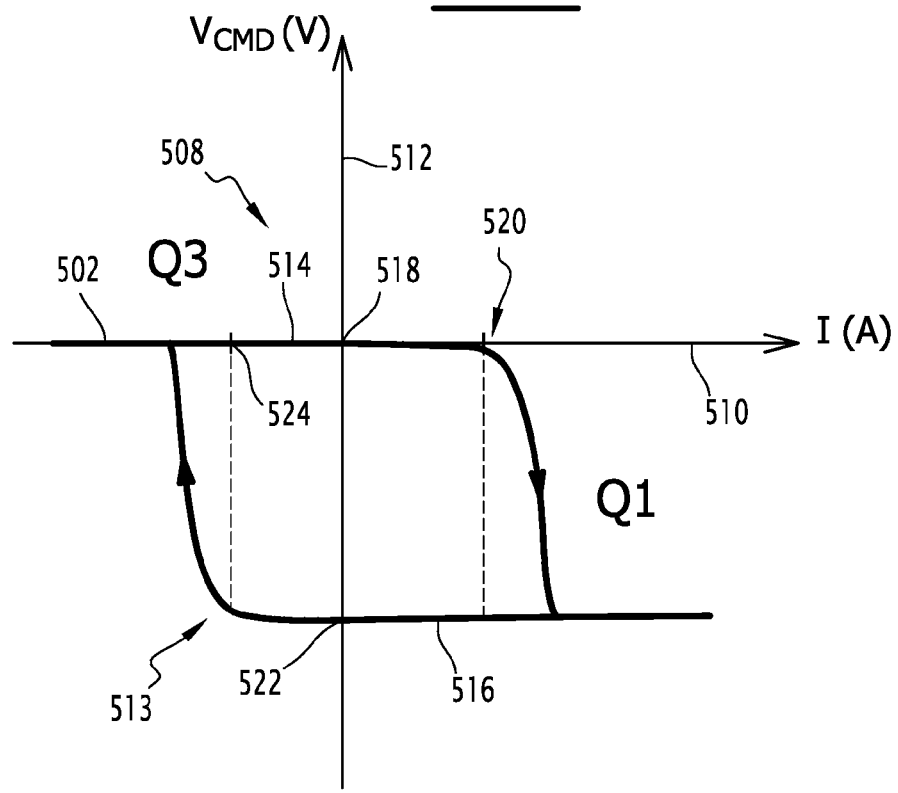
FIG. 8 shows the evolution of the control voltage of the gate of the power transistor as a function only of the image current sensed by the image current sensor.

According to FIG. 8, one example of an evolution curve 502 of the control voltage $V_{CMD}$ applied to the gate G of the power transistor 258 as a function of the image current alone is shown in reference 508.

The reference 508 comprises, on the X axis, a first image current axis 510, and a second control voltage axis 512 of the voltage of the gate G of the power transistor 258.

The curve 502 corresponds to a first command embodiment in which the control voltage $V_{CMD}$ of the gate G depends solely on the image current, i.e., the power current of the power transistor 258.

The evolution curve 502 of the control voltage $V_{CMD}$ as a function of the image current alone describes the first hysteresis loop 513, and comprises a first section 514 oriented in the direction of an increasing image current and a second section 516 oriented in the direction of a decreasing image current.

In the first section 514, whereas initially the gate control voltage is equal to a first control voltage value 518, here 0 V, as long as the image current remains below a first activation threshold value 520, the value of the control voltage $V_{CMD}$ is equal to the first value 518 of the control voltage.

When the image current exceeds the first activation threshold value 520 in the increasing image current, the control voltage decreases as far as a second control voltage value 522 and remains at that value if the image current continues to increase.

In the second section 516, whereas initially the gate control voltage is equal to the second control voltage value 522, as long as the image current remains greater than or equal to a second image current activation threshold value 524, the value of the control voltage is equal to the second control voltage value 522.

When the image current exceeds the second image current activation threshold value 524 while decreasing, the control voltage decreases abruptly as far as the first control voltage value 518 and remains at that value if the image current continues to decrease.

Figure 9:
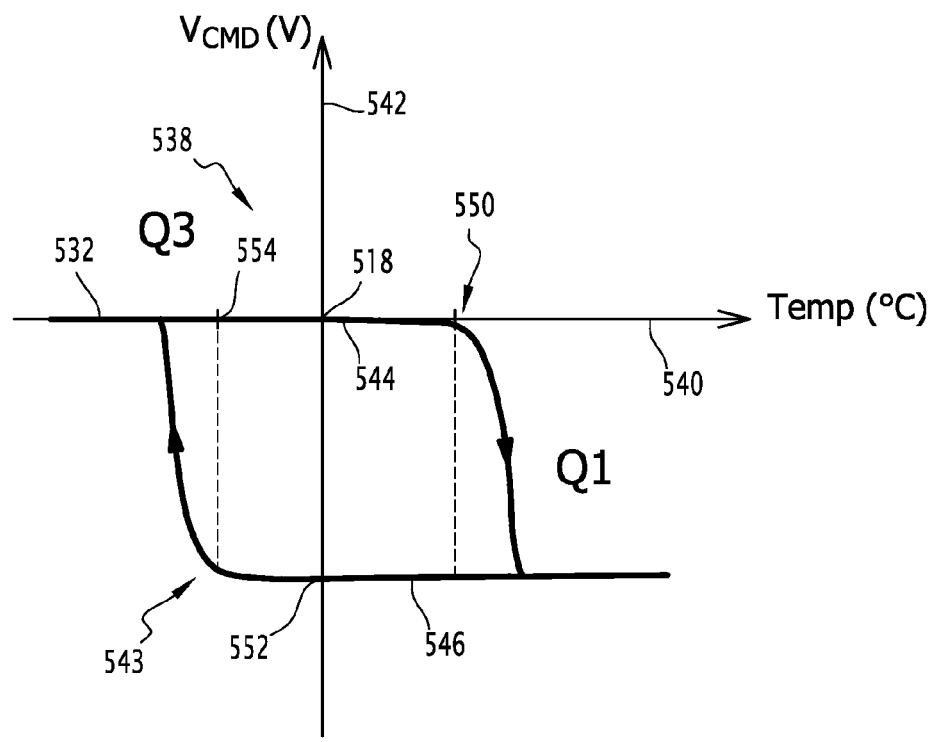
FIG. 9 shows the evolution of the control voltage of the gate of the power transistor as a function only of the temperature, sensed by the temperature sensor.

In FIG. 9, an example of an evolution curve 532 of the control voltage $V_{CMD}$ applied to the gate G of the power transistor 258 as a function of the temperature T alone is shown in reference 538.

The reference 538 comprises, on the X axis, a first temperature axis 540, and a second control voltage $V_{CMD}$ axis 542 of the voltage of the gate G of the power transistor 258.

The curve 532 corresponds to a second control embodiment in which the control voltage $V_{CMD}$ of the gate G depends only on the temperature prevailing within the power transistor 258.

The evolution curve 532 of the control voltage $V_{CMD}$ as a function of the temperature alone describes a first hysteresis loop 543, and comprises a first section 544 oriented in the direction of increasing temperature and a second section 546 oriented in the direction of decreasing temperature.

In the first section 544, whereas initially the gate G control voltage is equal to the first control voltage value 518, here 0 V, as long as the temperature T remains below a first temperature activation threshold value 550, the value of the control voltage is equal to the first control voltage value 518.

When the temperature exceeds the first temperature activation threshold value 550 with the temperature increasing, the control voltage $V_{CMD}$ decreases to a third control voltage value 552 and remains at that value if the temperature T continues to increase.

In the second section 546, whereas initially the gate G control voltage $V_{CMD}$ is equal to the third control voltage value 552 of the gate G, as long as the temperature T remains greater than or equal to a second temperature activation threshold value 554, the value of the control voltage $V_{CMD}$ is equal to the third control voltage value 55.

When the temperature T exceeds the second temperature activation threshold value 554 while decreasing, the control voltage $V_{CMD}$ decreases abruptly to the first control voltage value 518 and remains at that value if the temperature continues to decrease.

In practice, a third embodiment of the control function combines the first and second embodiments, and in that embodiment, the control voltage $V_{CMD}$ of the gate G depends both on the image current and the temperature.

It should be noted that temperature is first and foremost a safety perimeter of the limiter itself, while the image current is a safety perimeter of the voltage source of the first branch, and more generally of the power supply system.

In the third embodiment, the most conservative control voltage, i.e., that which corresponds to the largest threshold value, is applied relative to a state crossing the thresholds of the pairs of parameters formed by the image current and the temperature.

For example, if the second control voltage value has a corresponding saturation current that is lower than the saturation current corresponding to the third control voltage value, and if the first image current activation threshold value is crossed by increasing while the first temperature activation threshold value is not crossed, then the second voltage value is applied.

If the first temperature activation threshold value is crossed by increasing while the first image current activation threshold value is not crossed, then the third voltage value is applied.

If the first image current activation threshold value and the first temperature activation threshold value are crossed while increasing, then the third voltage value is applied.

If the control voltage initially applied is equal to the third control voltage value, if the second temperature activation threshold value is crossed while decreasing while the second image current threshold value is not crossed while decreasing, then the second control voltage value is applied.

If the control voltage initially applied is equal to the third control voltage value, if the second image current activation threshold value is crossed while decreasing while the second activation threshold value of the decreasing temperature is not crossed while decreasing, then the control voltage remains at the third control voltage value.

If the control voltage initially applied is equal to the third control voltage value, if the second temperature activation threshold value and the second image current threshold value are not crossed while decreasing, then the first control voltage value is applied.

Figure 10:
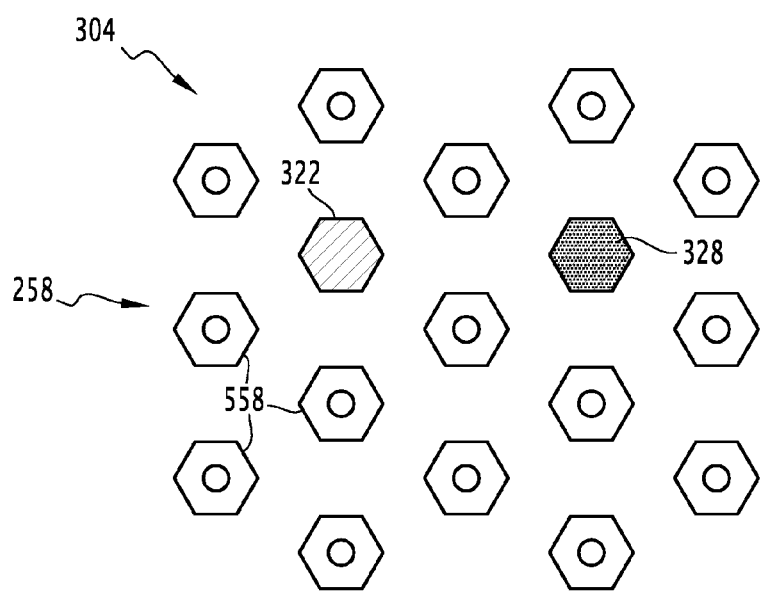
FIG. 10 is a top view of lateral extensions of a multilayer integrated electronic component forming the current limiter of FIG. 6 and integrating its various functions.

According to FIG. 10, one example of implantation of the transistors of the integrated electronic limiter component 304 is proposed, in which the JFET power transistor 258 is a VJFET transistor, distributed among several basic power transistors 558, whereof the basic electrodes of the same type are connected to each other.

The drain-type electrodes, source-type and gate-type electrodes, respectively, are connected to each other, to form the drain electrode D, or the source electrode S and the gate electrode(s) of the power transistor 258, respectively.

The planar layers of various materials, in particular the semiconducting materials, forming each basic transistor have a generally hexagonal shape.

The basic power transistors 558 are distributed in a mesh of hexagonal cells, each basic power transistor 558 making up a node of that mesh.

According to FIG. 10, the image current sensor 322 is a VJFET-type transistor with a structure similar to the basic power transistors 558 in terms of vertical distribution of the various types of layers. The current sensor 322 is a node in the mesh formed by the basic power transistors 558.

The temperature sensor 328 is based on a VJFET transistor, with a structure similar to the basic power transistors 558 in terms of vertical distribution of the various types of layers making up the limiter component 304. The temperature sensor 328 is also a node in the mesh formed by the basic power transistors 558.

Figure 11:
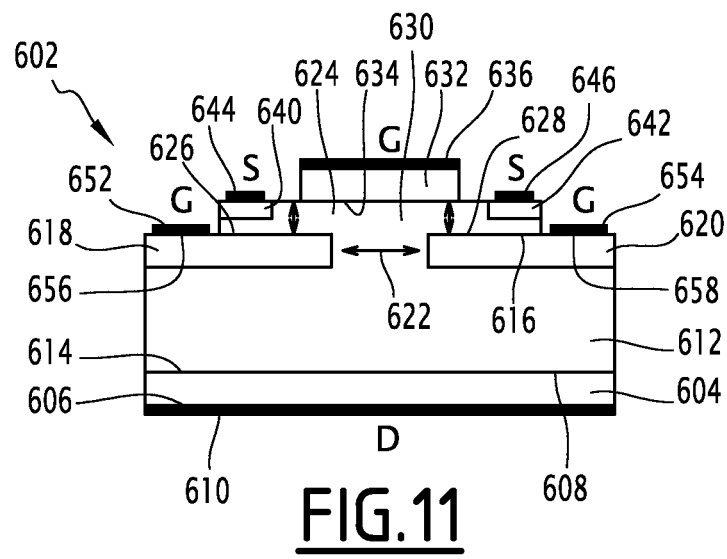
FIG. 11 is an elevation view of the layers of a first embodiment of a basic power transistor of the integrated electronic component of FIG. 10.

According to FIG. 11 and a first embodiment 602 of the basic power transistor 558, the basic power transistor 602 comprises:
a substrate 604 with a first type of conductivity, for example an n-type epitaxy layer, having a first lower face 606 and a first upper face 608;
a drain electrode 610 in contact with the first lower face 606 of the substrate 604;
a first semiconducting region 612 of the first conductivity type, having a second lower face 614 arranged on the first upper face 608 of the substrate 604, and the second upper face 616;
a second 618 and third 620 semiconducting region of a second conductivity type, for example of type p, partially buried, arranged inside the first semiconducting region 612 under the second upper face 616 and defining a vertical channel 622 inside the first region 612;
a fourth semiconducting region 624, of the first conductivity type as for the first region, centrally, partially and respectively covering a third 626 and fourth 628 upper face of the second 618 and third 620 regions, the fourth region 624 forming a side channel 630,
a fifth semiconducting region 632 of the second conductivity type, called surface, centrally and partially covering a fifth upper face 634 of the fourth semiconducting region 624,
a first control gate electrode 636 positioned on the fifth semiconducting region 632;

a first contact area 640 and a second contact area 642 symmetrical with respect to each other, positioned under the fifth upper face 634 in two areas not covered by the fifth region 632;
a first source electrode 644 and a second source electrode 646 respectively positioned on the first contact area 640 and the second contact area 642; and
a second gate electrode 652 and a third gate electrode 654 respectively positioned on a sixth upper face 656 of the second semiconducting region 618 and a seventh upper face 658 of the third semiconducting region 620 in areas not covered by the fourth semiconducting region 624.

Figure 12:
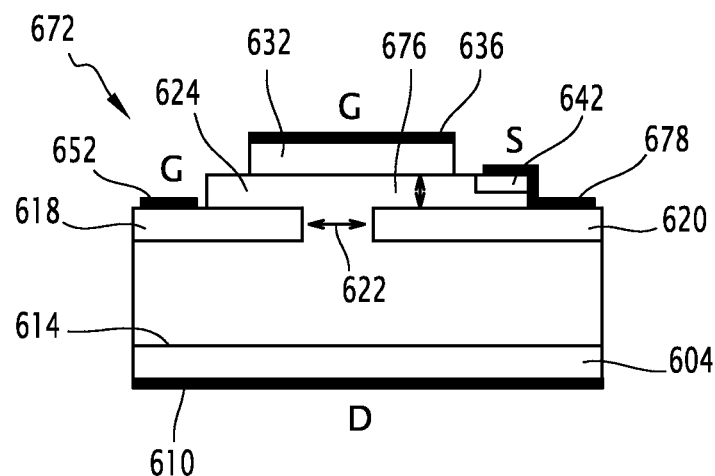
FIG. 12 is an elevation view of the layers of a second embodiment of a basic power transistor of the integrated electronic component of FIG. 10.

According to FIG. 12, a second embodiment 672 of a power transistor 658 is shown in which the elements identical to those of the first embodiment 602 of the basic power transistor described in FIG. 10 are designated using identical reference numbers.

The shared elements are the elements designated by numerical references 604, 610, 614, 618, 620, 622, 624, 632, 636, 642, 652.

The basic power transistor 672 includes a second control gate 652 of a buried depletion region, here the second region 618, the second control gate of a depletion region having been eliminated here.

Likewise, the first source electrode 644 and its associated contact area 640 have been eliminated.

The second source electrode 646 has been replaced by a single source electrode 678 whereof a portion covers the contact area 642, overhangs the top face of the fourth region 624 on the right in FIG. 12, and is extended by a second portion that covers the third region 620.

Thus, the pinching width of the vertical channel 622 situated between the vertical walls of the second region 618 and the third region 620 depends on the voltage supplied to the gate electrode 652 and the voltage supplied to the single source electrode 678.

The side channel 678 here is, contrary to the side channel of FIG. 11, an asymmetrical channel situated on the right in FIG. 12 and defined by the upper face of the third region 620 and the upper face of the fourth region 624.

Figure 13:
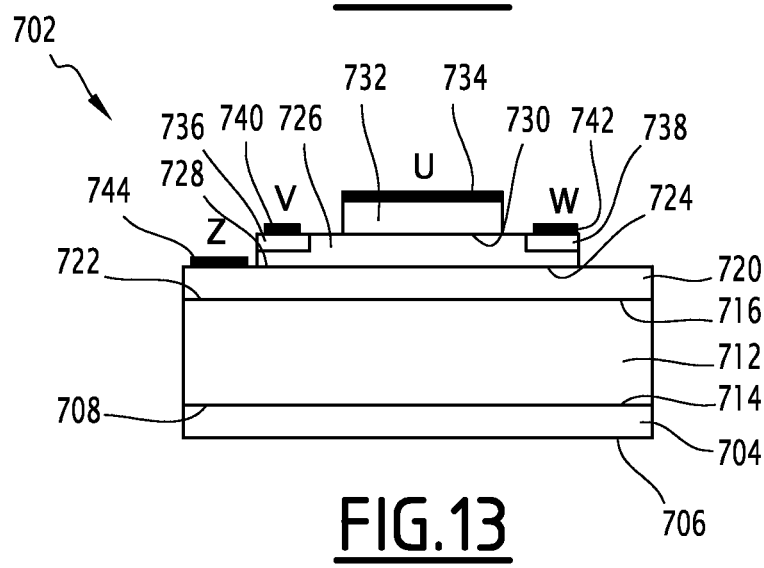
FIG. 13 is an elevation view of the layers of a temperature sensor of the electronic component of FIG. 10.

According to FIG. 13, a temperature sensor 328 is a multilayer electronic component 702 of a type similar to the basic power transistors 602, 672.

The electronic temperature sensor 702 comprises:
a substrate 704 of the first conductivity type, for example an n-type epitaxy layer, having a first lower face 706 and a first upper face 708 forming a first layer;
a first semiconducting region 712 of the first conductivity type, forming a second layer having a second lower face 714 arranged on the first upper face 708 of the substrate 704, and a second upper face 716;
a second semiconducting region 720 of the second conductivity type, for example of type p, forming a third layer having a third lower face 722 completely covering the second upper face 716 and a third upper face 724,
a third semiconducting region 726 of the first conductivity type, forming a fourth layer having a fourth lower face 728 centrally, partially and respectively covering the third upper face 724, and a fourth upper face 730;
a fourth semiconducting region 732 of the second conductivity type, forming a fifth layer centrally and partially covering the fourth upper face 730 of the third semiconducting region 726;
a first electrode 734 positioned on the fourth semiconducting region 732 and designated by the letter U;

the first contact area 736 and the second contact area 738 that are symmetrical relative to each other, positioned under the fourth upper face 730 in an area not covered by the fourth region 732;

a second electrode 740 and a third electrode 742, respectively positioned on the first contact area 736 and the second contact area 738, and respectively designated by the letters V and W; and a fourth electrode 744 positioned on the upper face of the second semiconducting region, designated by the letter Z.

Different types of combinations of electrodes U, V, W, Z can be used to produce the temperature sensor, the second semiconducting region 720 serving as an insulating layer.

The V-U junction or the W-U junction constitutes a temperature sensor of the P-N junction type.

The V-W junction constitutes a temperature sensor of the resistive type.

The V-U-W double junction constitutes a temperature sensor of the lateral JFET type.

It should be noted that the different functions performed by the transistors previously described in FIGS. 11, 12 and 13 can also be performed alternatively by transistors in which the N and P type areas described in FIGS. 11, 12 and 13 are inverted.

It should also be noted that the functions previously described and integrated on the same semiconductor substrate according to FIG. 10 can also alternatively be made on different chips assembled in the same housing or module.

According to FIG. 14, a method 802 for implementing the protection of a power supply system as described in FIG. 1 or FIG. 5 comprises a series of one or more steps.

In a first step 804, when the first supply branch is operating normally, the current limiting FET power transistor operates in the first area, i.e., without current limitation and with reverse polarization, the gate G being set at a potential corresponding to the smallest pinching of the channel of the power transistor, i.e., the largest achievable channel width.

In a second step 806, when a short-circuit defect internal to part or all of the voltage source of the first supply branch 12 occurs, the FET power transistor operates in the second area, in direct conduction mode with a current limitation from a predetermined current threshold value.

In one alternative, the two steps 804, 806 can be implemented alone and the method does not comprise the steps in which a control member varies the voltage of the gate G to control the value of the current limiting threshold in particular as a function of the image current and the temperature T.

The method 802 comprises a third step 808, after the first step 804 and before the second step 806. Alternatively, the third step 808 is omitted.

In the third step 808, when the first supply branch operates normally in terms of the non-occurrence of an internal short-circuit defect of the first voltage source, when the current passing through the power transistor exceeds the rated current value and the temperature of the limiter remains below a first temperature threshold value of the transistor, the power transistor continues to operate in the first area.

In the same third step 808, when the first supply branch operates normally in terms of the non-occurrence of an internal short-circuit defect of the first voltage source, when the current passing through the power transistor exceeds the rated current value and the temperature of the limiter exceeds the first temperature threshold value of the transistor while increasing, a cutoff member, such as a circuit breaker or a fuse, for example, cuts off the transistor. Thus, the third step 808 protects the power supply system in case of overload or short-circuit on the charge.

In a fourth step 810, before the step 806 and after the step 804, the image current sensor measures a current that is representative of the power current passing through the power transistor. When a defect occurs on the first branch in terms of an internal short-circuit of the first voltage source, the power current and the image current invert their directions, and when the image current exceeds a first activation threshold value, the control member sends a command to set the voltage of the gate G of the power transistor to a second gate voltage value so as to adjust a second saturation value of the power current.

In the same fourth step 810, when the supply branch is operating normally, the control voltage of the gate remains at the first control value and the transistor operates in the first area.

In a second embodiment of step 810, the temperature sensor measures a temperature that is representative of the temperature of the junction of the power transistor. When a defect occurs on the first branch in terms of an internal short-circuit of the first voltage source, the power current and the image current invert their directions and when the temperature exceeds a first temperature activation threshold value, the control unit sends a command to set the voltage of the gate G of the power transistor to a third second gate voltage value so as to adjust a third saturation value of the power current.

In a third embodiment of the fourth step 810, the temperature sensor measures the temperature and the current sensor measures the image current. When a defect occurs on the first branch in terms of an internal short-circuit of the first voltage source, the power current and the image current invert their directions and when the temperature exceeds a first temperature activation threshold value while decreasing and/or when the image current exceeds a first image current activation threshold value while increasing, the control member sends a command to set the voltage of the gate G of the power transistor to a conservative control voltage value relative to the state exceeding the pair formed by the first image current activation threshold and the first temperature activation threshold.

The conservative voltage value is the voltage value among the second and third control voltage values that corresponds to the smallest saturation current value when the first image current activation threshold and the first temperature activation threshold have been exceeded.

When only the first image current activation threshold is exceeded, the control voltage is equal to the second control voltage value.

When only the first temperature activation threshold is exceeded, the control voltage is equal to the third control voltage value.

In practice, in the third alternative of the fourth step 810, the value of the saturation current corresponding to the third control voltage value is smaller than the value of the saturation current corresponding to the third control voltage value.

In a first embodiment of the fifth step 812 after the second step 806, the power transistor operates in the second limiting area. When the internal short-circuit defect of the first voltage source ceases and the first supply branch again operates normally, when the control voltage is equal to the second control voltage value, when the image current sensor measures the image current, and when the image current exceeds a second image current activation threshold value while decreasing, the control member sets the control voltage of the gate G to the value of the first control voltage.

In a second embodiment of the fifth step 812, when the internal short-circuit defect of the first voltage source ceases and the first supply branch again operates normally, when the control voltage is equal to the third control voltage value, when the temperature sensor measures the temperature, and when the temperature exceeds a second temperature activation threshold value while decreasing, the control member sets the voltage of the gate G to the value of the first control voltage.

In a third embodiment of the fifth step 812, when the internal short-circuit defect of the first voltage source ceases and the first supply branch again operates normally, when the control voltage is equal to the second or third control voltage value, when the temperature sensor measures the temperature and the image current sensor measures the image current, when the temperature exceeds the second temperature activation threshold value while decreasing and/or when the image current exceeds the second first image current activation threshold value while decreasing, the control unit sends a command to set the voltage of the gate G of the power transistor to a conservative voltage value relative to the state exceeding the pair formed by the second image current activation threshold and the first temperature activation threshold.

The conservative voltage value is the first voltage value when the second image current activation threshold and the second temperature activation threshold are exceeded.

When the second image current activation threshold is exceeded, the control voltage is equal to the third voltage value.

When only the second temperature activation threshold is exceeded while decreasing, the control voltage is equal to the second voltage value.

In practice, in the third alternative of the fifth step 810, the value of the saturation current corresponding to the third control voltage value is smaller than the value of the saturation current corresponding to the third control voltage value.

In practice, when no current is circulating in the power transistor, the integrated component and the gate g voltage of the image current sensor are configured to allow a residual current to pass and to detect a current inversion when the first voltage source again operates normally.

When an inversion of the current is detected by the current sensor, the complete inhibition voltage of the power transistor is eliminated.

Thus, the monitoring of the sign of the residual current passing through the current sensor makes it possible to detect the elimination of the defect or the disappearance of that defect and thereby to ensure a return of the system to normal operation. In case of defect, the current goes from a negative value to a positive value, and the control system cuts the conduction of the main transistor while monitoring the sign of the current. If the current once again becomes negative, the control voltage blocking the power transistor is limited.

Alternatively, the elimination of the complete inhibition voltage of the power transistor is maintained as long as the power transistor operates in the first area.

According to FIG. 15, a view of the evolution of the major features of the limiter is provided for a particular operating sequence of the power supply system described in FIG. 1 or FIG. 5.

The characteristic properties comprise the power current, passing through the power transistor of the limiter, the image current sensed by the image current sensor, the temperature sensed by the temperature sensor, and the control voltage applied to the gate G of the power transistor.

A time evolution curve 904 of the power current, denoted Ip in FIG. 15, is shown in reference 906, including a time axis 908 on the X axis and a current axis 910, whereof the unit is expressed in amperes.

A time evolution curve 914 of the image current, denoted Ic-Im in FIG. 15, is shown in a reference 918, including a time axis 918 on the X axis and a current axis 920, whereof the unit is expressed in milliamperes.

A time evolution curve 924 of the temperature, denoted Temp in FIG. 15, is shown in a reference 926, including a time axis 928 on the X axis and a temperature axis 930, whereof the unit is expressed in degrees Celsius.

A time evolution curve 934 of the control voltage $V_{CMD}$ is shown in a reference 936, including a time axis 938 on the X axis and a voltage axis 940, whereof the unit is expressed in volts.

The sequence comprises a series of phases numbered 1 to 7.

In phase 1, the power supply system operates normally. The power transistor of the limiter is passed through by a current with a rated value and operates in the first area of its characteristic, i.e., in the third quadrant Q3.

In phase 2, the power supply system operates normally, but with a slight overload that amounts to a current passing through the power transistor with a slightly higher value that may go up to 1.3 times the value of the rated current.

It should be noted that when this overload is excessive, which amounts to a temperature increase that can irreparably damage the limiter, an additional cutoff device should be provided to cut off that overload current.

At the beginning of phase 3, a defect occurs on the power supply system that amounts to the internal short-circuiting of one or more modules of the first branch in which the limiter is serially connected and an inversion of the direction of the power current.

The image current sensor detects an inversion of the image current and generates a control voltage with a negative voltage applied to the gate G of the power transistor 258. The value of that control voltage also depends on the temperature measured by the temperature sensor. Here, the first temperature activation threshold has not been crossed and the value of the control voltage is equal to the second control value.

During phase 3, the value of the control voltage of the gate G is kept at the second value of the control voltage. However, the value of the saturation current corresponding to that command does not limit enough, and the temperature of the power transistor continues to increase dangerously.

At the beginning of phase 4, the temperature sensor detects that a critical temperature set by the first temperature activation threshold has been exceeded and the control unit generates a control voltage applied to the gate G equal to a third control voltage value. Here, the value of the third control voltage is higher than the value of the second control voltage and corresponds to the blocking of the power transistor, i.e., the cancellation of the power current. The image current continues, however, to be monitored by the image current sensor. The temperature decreases while the control voltage is kept at the third control voltage value.

In phase 5, the control voltage being kept at the third control voltage value, no power current circulates in the power transistor, only a residual current circulating in the transistor forming the image current sensor.

The temperature that has exceeded a second temperature activation threshold stays at a stable safety value.

At the end of phase 5, the internal short-circuiting the first branch disappears and the power supply system again begins to operate normally. This amounts to an inversion of the image current and generation of a control voltage applied to the gate G equal to the first control voltage value, i.e., 0 V.

The power transistor 258 again operates in the first area of its characteristic, i.e., in the third quadrant Q3.

In phase 6, the amplitude of the negative power current increases until it reaches the value of the rated current that passes through the first branch during normal operation.

In phase 7, the values of the characteristic parameters are permanent and identical to those of phase 1. The power supply system operates normally and the limiter is operational to protect the system in the event of a new internal short circuit on the first supply branch.

What is claimed is:

1. An electrical power supply system, capable of supplying an electrical charge with a predetermined power supply current, comprising a first supply branch and a second supply branch connected in parallel, the first supply branch comprising, connected in series, a first voltage source and a current limiter, and the second supply branch comprising a second voltage source, the first voltage source and the second voltage source each having, when they operate normally, a same electromotive force whereof a polarization direction and an amplitude are identical to a polarization direction and an amplitude of a supply voltage, the current limiter comprising a field effect power transistor with a first electrical connection terminal and a second electrical connection terminal and whereof a power channel defined between the first electrical connection terminal and the second electrical connection terminal forms an electric dipole connected in series to the first voltage source at the second connection terminal, the power transistor comprising an evolution characteristic of an electrical current passing through the power channel as a function of a differential electrical voltage between the first and second connection terminals, the differential electrical voltage being equal to an electrical voltage of the first terminal minus the electrical voltage of the second terminal and the electrical current passing through the power channel having a positive direction when it goes from the first connection terminal toward the second connection terminal, the evolution characteristic of the power transistor comprising a first inverse polarization area, wherein the electrical voltage and the current have the same negative direction and the current passing through the channel is not limited, and a second single-direction current limiting area, in direct conduction, in which the differential electrical voltage and the electrical current have the same direction and are positive and the electrical current passing through the power channel is current-limited from a current threshold, wherein the field effect power transistors is connected to the first voltage source with an inverse polarization, in a configuration where the voltage differential of the power transistor and the electromotive force of the first voltage source, when the first supply branch operates normally, are opposite, and the first supply branch is configured so that, when a defect occurs on the first voltage source, the electromotive force of the first voltage source is lower than the electromotive force of the second voltage source and the first supply branch operates as a receiver with respect to the second supply branch.

2. The electrical power supply system according to claim 1, wherein the voltage difference between the electromotive force of the second voltage source and the electromotive force of the defective first voltage source is greater than or equal to 20 V.

3. The electrical power supply system according to claim 1, wherein the ratio of the electromotive force of the defective first voltage source to the electromotive force of the second voltage source is less than or equal to 90%.

4. The electrical power supply system according to claim 1, wherein the field effect power transistor is a field effect transistor selected from the group consisting of JFET and MOS transistors, and whereof the semiconducting substrate comprises a material selected from the group consisting of a wide band gap comprising silicon, silicon carbide, gallium nitride GaN and diamond.

5. The electrical power supply system according to claim 1, wherein the power transistor is a transistor of the VJFET type whereof the substrate comprises silicon carbide.

6. The electrical power supply system according to claim 1, wherein the current limiter comprises:

the field effect power transistor having a drain electrode, a source electrode, and a gate electrode for controlling a saturation current, an image current sensor capable of providing an image current that is representative of the power current passing through the power channel of the power transistor, a sensor for a temperature that is representative of a temperature prevailing within the power transistor, and a control unit of the current limiter capable of commanding the power transistor as a function of measurement parameters comprised in the set made up of the temperature measured by the temperature sensor and the image current measured by the current sensor.

7. The electrical power supply system according to claim 1, wherein the power transistor comprises one or more basic power transistors, each basic power transistor comprising:

a substrate of a first conductivity type having a first lower face and a second upper face, a drain electrode in contact with the first lower face of the substrate, a first semiconducting region of the first conductivity type having a second lower face arranged on the first upper face of the substrate, and a second lower face, second and third semiconducting regions, of a second conductivity type, partially buried, arranged inside the first semiconducting region under the first upper face and defining a vertical channel inside the first region, a fourth semiconducting region of the first conductivity type, with a surface gate, centrally, partially and respectively covering a third and fourth upper face of the second and third regions, the fourth region forming a side channel, a fifth semiconducting region of the second conductivity type centrally and partially covering a fifth face of the fourth semiconducting region, a first control gate electrode positioned on the surface of the fifth region, at least one contact area positioned under the fifth face in an area not covered by the fifth region, at least one source electrode positioned on the at least one contact area, and a second gate electrode positioned either on a sixth upper face, or on a seventh upper face in an area not covered by the fourth semiconducting region.

8. The electrical power supply system according to claim 7, wherein the power transistor comprises a second gate electrode and a third gate electrode respectively positioned on the fifth upper face and the sixth upper face in areas not covered by the fourth semiconducting region, the two contact areas, positioned on either side of the vertical channel, under the fourth upper face in areas not covered by the fifth region, and two source electrodes each positioned on a different contact area.

9. The electrical power supply system according to claim 7, wherein the second gate electrode is positioned on the second semiconducting region, the power transistor comprises a single source electrode and a single contact area of the source electrode, and the source electrode, in a single piece, covers both the contact area and an area of the third semiconducting region not covered by the fourth semiconducting region.

10. A method for protecting a power supply system using a current limiter, the power supply system being able to supply an electrical charge of a predetermined supply current with a predetermined supply voltage, and comprising a first supply branch and a second supply branch connected in parallel, the first supply branch comprising, connected in series, a first voltage source and a current limiter, and the second supply branch comprising a second voltage source, the first voltage source and the second voltage source each having, when they operate normally, a same electromotive force whereof a polarization direction and an amplitude are identical to a polarization direction and an amplitude of a supply voltage, the current limiter comprising a field effect power transistor with a first electrical connection terminal and a second electrical connection terminal, and whereof a power channel defined between the first electrical connection terminal and the second electrical connection terminal forms an electric dipole connected in series to the first voltage source at the second connection terminal, the power transistor having an evolution characteristic of an electrical current passing through the power channel as a function of a differential electrical voltage between the first and second connection terminals, the differential electrical voltage being equal to an electrical voltage of the first terminal minus an electrical voltage of the second terminal and the electrical current passing through the power channel having a positive direction when it goes from the first connection terminal toward the second connection terminal, the evolution characteristic of the power transistor comprising a first inverse polarization area, in which the electrical voltage and current have a same negative direction and the current passing through the channel is not limited, and a second single-direction current limiting area, in direct conduction, in which the differential electrical voltage and the electrical current have the same direction and are positive and the electrical current passing through the power channel is current-limited from a current threshold, the field effect power transistor being connected to the voltage source with an inverse polarization such that the differential voltage of the power transistor and the electromotive force of the first voltage source, when the first supply branch operates normally, are opposite, and the first supply branch being configured such that, when a defect occurs on the first voltage source, the electromotive force of the first voltage source is lower than the electromotive force of the second voltage source and the first supply branch operates as a receiver with respect to the second supply branch, wherein the protection method comprises:

when the first supply branch operates normally, operating the power transistor in the first area, in inverse polarization without current limitation, and when a defect occurs on the first voltage source of the first supply branch, operating the power transistor in the second area, in direct conduction with current limitation from a current threshold value.

11. The method for protecting a power supply system according to claim 10, wherein the current limiter comprises the field effect power transistor having a drain electrode, a source electrode, and a gate electrode for controlling the saturation current, an image current sensor capable of providing an image current that is representative of the power current passing through the power channel of the power transistor, a control unit of the current limiter capable of commanding the power transistor (58) as a function of the image current measured by the current sensor, and wherein in said operating the power transistor in the first area, the gate of the power transistor is set to a first reference control voltage value, and wherein the method further comprises, before said operating the power transistor in the second area and after said operating the power transistor in the first area:

measuring the current representative of the power current passing through the power transistor using the image current sensor, when a defect occurs on the first supply branch, inverting directions of the power current and the image current and when the image current exceeds a first activation threshold value, operating the control unit to send a command to set the voltage of the gate of the power transistor to a second gate voltage value so as to adjust a second saturation value of the power current, and when the first supply branch operates normally, operating the control voltage of the gate to remains at the first control value and operating the power transistor in a first area.

12. The method for protecting a power supply system according to claim 11, wherein the current limiter also comprises a sensor for a temperature that is representative of a temperature prevailing within the power transistor, and the control unit of the current limiter that is capable of commanding the power transistor as a function of measurement parameters comprised in the set consisting of the temperature measured by the temperature sensor and the image current measured by the current sensor, and the temperature sensor measures the temperature and the current sensor measures the image current, when a defect occurs on the first voltage source of the first supply branch, the power current and the image current invert their directions and when the temperature exceeds a first temperature activation threshold value while increasing and/or when the image current exceeds a first image current activation threshold value while increasing, the control unit sends a command to set the voltage of the gate of the power transistor to a conservative control voltage value relative to the state exceeding the pair formed by the first image current activation threshold and the first temperature activation threshold, the value of the conservative control voltage being the voltage value from among the second and third control voltage values that corresponds to the smallest saturation current value when the first image current activation threshold and the first temperature activation threshold are exceeded, the value of the conservative control voltage being equal to the second control voltage value when only the first image current activation threshold is exceeded, and the value of the conservative control voltage being equal to the third control voltage value when only the first temperature activation threshold is exceeded.

13. The method for protecting a power supply system according to claim 12, wherein
- when no current circulates in the power transistor and the current sensor provides an image value thereof corresponding to a bias, the temperature sensor continues to monitor the image current, and
- when an inversion of the current is detected by the current sensor that is representative of the switch of an operation of the limiter from the first area into the second area, the control voltage completely inhibiting circulation of the power current in the power transistor is eliminated.

* * * * *

UNITED STATES PATENT AND TRADEMARK OFFICE
CERTIFICATE OF CORRECTION

PATENT NO. : 9,030,796 B2  
APPLICATION NO. : 13/824898  
DATED : May 12, 2015  
INVENTOR(S) : Franck Sarrus Page 1 of 1

It is certified that error appears in the above-identified patent and that said Letters Patent is hereby corrected as shown below:

Claims

In column 23 at line 51, In Claim 1, change "transistors" to --transistor--.

In column 24 at line 33, In Claim 7, change "transistors ," to --transistors,--.

In column 24 at line 41, In Claim 7, change "regions," to --regions--.

In column 26 at line 14, In Claim 11, change "(58) as" to --as--.

In column 26 at line 33, In Claim 11, change "remains" to --remain--.

Signed and Sealed this  
Ninth Day of February, 2016

Michelle K. Lee  
*Director of the United States Patent and Trademark Office*